(12) United States Patent
Narazaki

(10) Patent No.: US 8,552,468 B2
(45) Date of Patent: Oct. 8, 2013

(54) POWER SEMICONDUCTOR DEVICE

(75) Inventor: Atsushi Narazaki, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 707 days.

(21) Appl. No.: 12/724,987

(22) Filed: Mar. 16, 2010

(65) Prior Publication Data

US 2010/0308401 A1    Dec. 9, 2010

(30) Foreign Application Priority Data

Jun. 4, 2009   (JP) ................................ 2009-135022

(51) Int. Cl.
 *H01L 29/74*   (2006.01)

(52) U.S. Cl.
 USPC ........... 257/133; 257/135; 257/329; 257/330; 257/331

(58) Field of Classification Search
 USPC ................. 257/133, 135, 329–331
 See application file for complete search history.

(56) References Cited

U.S. PATENT DOCUMENTS

| | | | |
|---|---|---|---|
| 7,622,351 B2 * | 11/2009 | Kobayashi | ............... 438/259 |
| 2007/0040213 A1 | 2/2007 | Hotta et al. | |

FOREIGN PATENT DOCUMENTS

| | | |
|---|---|---|
| JP | 5-41515 | 2/1993 |
| JP | 6-291178 | 10/1994 |
| JP | 7-245294 | 9/1995 |
| JP | 8-167711 | 6/1996 |
| JP | 11-345969 | 12/1999 |
| JP | 2000-515684 | 11/2000 |
| JP | 2001-250947 | 9/2001 |
| JP | 2001-308328 | 11/2001 |
| JP | 2002-538602 | 11/2002 |
| JP | 2007-59805 | 3/2007 |
| JP | 2007-173878 | 7/2007 |
| JP | 2007-258617 | 10/2007 |
| JP | 2008-21918 | 1/2008 |
| JP | 2009-170629 | 7/2009 |
| WO | WO 2005/048352 A1 | 5/2005 |

OTHER PUBLICATIONS

Office Action issued Oct. 7, 2011 in German Patent Application No. 10 2010 021 128.1-33 (with English translation).
Japanese Office Action issued Jan. 31, 2012, in Patent Application No. 2009-135022 (with English-language translation).
Office Action issued Oct. 25, 2011, in Japanese Patent Application No. 2009-135022 with English translation.

* cited by examiner

*Primary Examiner* — Samuel Gebremariam
(74) *Attorney, Agent, or Firm* — Oblon, Spivak, McClelland, Maier & Neustadt, L.L.P.

(57) ABSTRACT

A semiconductor layer has a first layer of first conductive type, a second layer of second conductive type, and a third layer. The third layer has a first region of first conductive type, and a second region of second conductive type. A second electrode is in contact with each of the first and second regions. A trench is formed on the semiconductor layer at a surface opposite to its surface facing a first electrode. A gate electrode is embedded in the trench with a gate insulating film interposed therebetween. The gate electrode includes a first portion projecting into the first layer through the first region and the second layer, a second portion projecting into the first layer through the second region and the second layer. The second portion projects into the first layer deeper than a depth in which the first portion projects into the first layer.

3 Claims, 37 Drawing Sheets

POWER SEMICONDUCTOR DEVICE

BACKGROUND OF THE INVENTION

1. Field of the Invention

The present invention relates to a power semiconductor device, in particular, a power semiconductor device having a gate electrode embedded in a trench.

2. Description of the Background Art

Some power semiconductor devices are used as non-contact switches for controlling a large amount of power. Such devices with large capacities are applied to, for example, inverter circuits in household electric appliances such as air conditioners, refrigerators, and washing machines, each of which has been developed with emphasis on energy saving, and are also applied to motor control in trains such as Shinkansen bullet trains and underground railways. Further, in recent years, in consideration of global environment, power semiconductor devices have begun to be applied to use in controlling an inverter/converter of a hybrid car traveling using both an electric motor and an engine, and use in a converter for solar photovoltaic power generation or wind power generation. As such, the field of application of power semiconductor devices is getting wider.

As the power semiconductor devices described above, for example, an IGBT (Insulated Gate Bipolar Transistor) is exemplified. An IGBT is a representative switching element for controlling a large current while securing small loss.

Now, a principle of operations of the IGBT is briefly described.

Described first is turning-on. By applying a sufficient positive voltage (for example, +15V) between a gate and an emitter, a MOSFET (Metal Oxide Semiconductor Field Effect Transistor) provided on the surface side of the IGBT is turned on. Accordingly, a region between a collector $p^+$ layer and an $n^-$ drift layer is forward-biased to inject positive holes from the $p^+$ layer to the $n^-$ layer. An amount of electrons corresponding to the amount of charge of the injected positive holes are concentrated in the $n^-$ drift layer to decrease the resistance of the $n^-$ drift layer (conductivity modulation). In this way, the IGBT is brought into the on state.

Described second is turning-off. When the gate-emitter voltage is decreased, the MOSFET provided on the surface side of the IGBT is turned off. Accordingly, the injection of positive holes from the collector $p^+$ layer is stopped, resulting in depletion of the $n^-$ drift layer. Accordingly, positive holes having been already injected are discharged to the emitter side, thereby interrupting the current.

The decrease of resistance of the $n^-$ drift layer caused by the conductivity modulation in the on state means reduced resistance of the device, and the collector-emitter voltage on this occasion is called "on voltage". The current obtained from the positive holes remaining upon the turning-off results in switching loss. Hence, as more positive holes and electrons (hereinafter, collectively referred to as "carriers") are injected into the $n^-$ drift layer to achieve reduced resistance, the loss (switching loss) resulting from the carriers remaining upon the turning-off is increased. In other words, there is a tradeoff relation between the on voltage and the switching loss.

To remedy this tradeoff characteristic, a trench type IGBT is disclosed in which transistor cell density is improved using a microfabrication technique. The trench type IGBT has a gate electrode embedded in a trench, which is formed on a semiconductor layer, with a gate insulating film interposed therebetween. A technique for forming such a trench is disclosed in, for example, Japanese Patent Laying-Open No. 06-291178. In addition, apart from the IGBT, a CSTBT (Carrier Stored Trench-gate Bipolar Transistor), an IEGT (Injection Enhanced Gate Transistor), and the like have been developed in each of which carrier density in a drift layer is improved.

When unexpected events occur such as load short and arm short, a large current/high voltage is applied to the IGBT. Even in such a situation, the IGBT element needs to withstand up to a certain degree of energy. In the course of collector voltage increase and current attenuation caused by the gate turning off upon occurrence of the short circuit, carriers (positive holes) stored in the $n^-$ drift layer are drained corresponding to dv/dt, i.e., a time differential value of the collector-emitter voltage. If the positive hole currents flow through base regions of parasitic npn transistors of the MOSFET, the IGBT is likely to be latched up disadvantageously.

An exemplary technique for preventing such latch-up is disclosed in Japanese Patent Laying-Open No. 2008-021918. According to Japanese Patent Laying-Open No. 2008-021918, a semiconductor device includes a collector layer of a first conductive type; a semiconductor layer of a second conductive type; a base region of the first conductive type; an emitter region of the second conductive type; a first trench; a first gate electrode; a second trench; a second gate electrode; an emitter electrode connected to the base region and the emitter region; and a collector electrode connected to the collector layer. The semiconductor layer is formed on the collector layer. The base region is formed at a surface of the semiconductor layer. The emitter region is formed at a portion of a surface of the base region. In order to form the first trench, the surface of the emitter region is dug to reach the semiconductor layer. The first gate electrode is embedded in the first trench with a first insulating film interposed therebetween. In order to form the second trench, the surface of the base region other than the emitter region is dug to reach the semiconductor layer. The second gate electrode is embedded in the second trench with a second insulating film interposed therebetween. The second trench is deeper than the first trench.

According to the above-described technique of Japanese Patent Laying-Open No. 2008-021918, in addition to the first gate electrode essential to an IGBT, the second gate, an extra gate dedicated to prevention of latch-up, has to be provided. This greatly changes the structure of an IGBT, thus greatly varying electric characteristics of an IGBT.

SUMMARY OF THE INVENTION

The present invention is made in view of the foregoing problems, and its object is to provide a power semiconductor device capable of preventing occurrence of latch-up.

A power semiconductor device of the present invention has first and second electrodes, a semiconductor layer, a gate insulating film, and a gate electrode. The semiconductor layer is provided on the first electrode. The semiconductor layer has a first layer of a first conductive type, a second layer of a second conductive type, and a third layer. The first layer is provided on the first electrode. The second layer is provided on the first layer. The third layer is provided on the second layer. The third layer has a first region of the first conductive type, and a second region of the second conductive type. The second electrode is in contact with each of the first and second regions. A trench is formed on the semiconductor layer at a surface opposite to its surface facing the first electrode. The gate insulating film covers an inner wall of the trench. The gate electrode is embedded in the trench with the gate insulating film interposed therebetween. The gate electrode includes a first portion projecting into the first layer through the first region and the second layer, and a second portion projecting into the first layer through the second region and the second layer. The second portion projects into the first layer deeper than a depth in which the first portion projects into the first layer.

According to the power semiconductor device of the present invention, the second portion of the gate electrode projects into the first layer deeper than the depth in which the first portion of the gate electrode projects into the first layer. Accordingly, a large current flows in the vicinity of the second portion, whereas a small current flows in the vicinity of the first portion. This achieves a reduced current flowing in the in-plane direction in the second layer just below the first region. In this way, occurrence of latch-up can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be described below with reference to figures.

Some figures show the coordinate axes of an XYZ coordinate system. The X direction represents a direction in which a gate electrode extends, the Y direction represents a direction in which each stripe in a stripe cell of a transistor extends, and the Z direction represents a thickness direction. The zero point of the Z axis represents the location of an interface between a third layer (n+ source regions and p+ contact regions) and an emitter electrode 11. The positive direction of the Z axis represents a direction from the zero point toward a semiconductor layer.

First Embodiment

Figure 1:
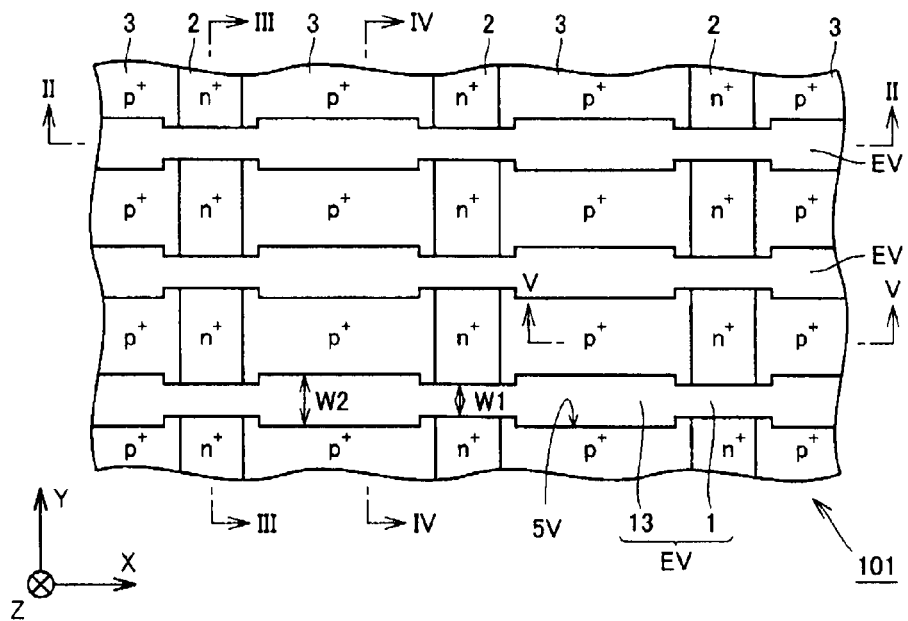
FIG. 1 is a partial plan view schematically showing a configuration of a power semiconductor device of a first embodiment of the present invention.

Referring to FIGS. 1-5, a configuration of an IGBT 101 will be described which serves as a power semiconductor device of the present embodiment. FIG. 1 shows a transistor cell of IGBT 101 when viewed from the emitter side. For visibility in FIG. 1, an emitter electrode 11, an interlayer insulating film 10, and a gate insulating film 9 described below are not shown therein.

IGBT 101 has a collector electrode 12 (first electrode), emitter electrode 11 (second electrode), gate insulating film 9, a gate electrode EV, interlayer insulating film 10, and a semiconductor layer. The semiconductor layer is provided on collector electrode 12, and has a p+ collector layer 6 (fourth layer) of p type (second conductive type), an n+ buffer layer 7 of n type (first conductive type), an n− drift layer 8 (first layer) of n type, a p base layer 14 (second layer) of p type (second conductive type), and a below-described third layer.

The third layer has n+ source regions 2 (first regions) of n type, and p+ contact regions 3 (second regions) of p type. When viewed in a planar view (FIG. 1), n+ source regions 2 and p+ contact regions 3 are formed in the form of stripes in a direction perpendicular to trenches 5V. In other words, n+ source regions 2 and p+ contact regions 3 constitute a so-called stripe cell.

p+ collector layer 6 is provided on collector electrode 12. Provided on p+ collector layer 6 is n+ buffer layer 7. Provided on n+ buffer layer 7 is n− drift layer 8. In other words, n− drift layer 8 is provided over collector electrode 12 with p+ collector layer 6 and n+ buffer layer 7 interposed therebetween. P base layer 14 is provided on n− drift layer 8. The third layer, i.e., n+ source regions 2 and p+ contact regions 3, is provided on p base layer 14.

On the semiconductor layer at a surface (surface shown in FIG. 1) opposite to the surface facing collector electrode 12, each of trenches 5V is formed. Gate insulating film 9 covers the inner wall of trench 5V. Gate electrode EV is embedded in trench 5V with gate insulating film 9 interposed therebetween.

Gate electrode EV includes first portions 1 each projecting into n− drift layer 8 through n+ source regions 2 and p base layer 14, and second portions 13 each projecting into n− drift layer 8 through p+ contact regions 3 and p base layer 14. First portions 1 and second portion 13 are formed in one piece. Namely, when viewed in a planar view, gate electrode EV is provided to transverse the striped arrangement of n+ source regions 2 and p+ contact regions 3. In this way, n+ source regions 2 and p+ contact regions 3 are configured to have the same potential.

Each first portion 1 and each second portion 13 of gate electrode EV have thicknesses D1 and D2 (FIG. 2) respectively. Thickness D2 is greater than thickness D1. Hence, second portion 13 (FIG. 4) projects into n− drift layer 8 deeper than the depth in which first portion 1 (FIG. 3) projects into n− drift layer 8. Trench 5V has portions in which first portion 1 and second portion 13 are embedded. These portions of trench 5V have widths W1 and W2 (FIG. 1). Therefore, in trench 5V, a portion in which second portion 13 is embedded has a width wider than that of a portion in which first portion 1 is embedded.

Figure 3:
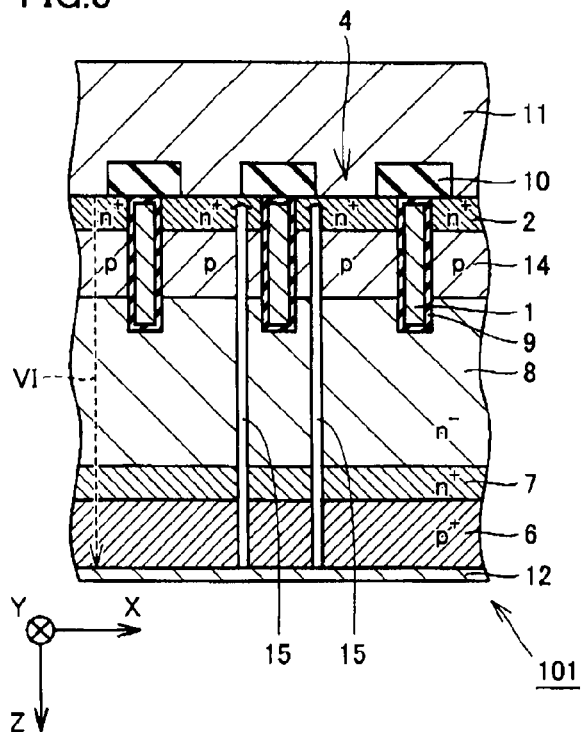
Figure 4:
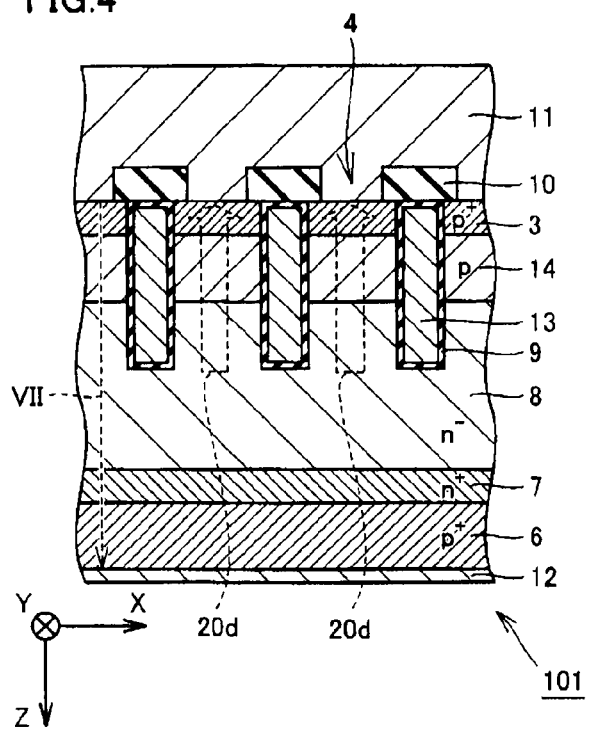

Emitter electrode 11 is in contact with each of n+ source regions 2 and p+ contact regions 3 at the location of an emitter contact 4 (FIGS. 3, 4). Emitter electrode 11 is insulated from gate electrode EV by interlayer insulating film 10.

As a specific dimension thereof, for example, thickness D1 is approximately 6 μm and thickness D2 is approximately 7 μm in the case where the IGBT is of 600 V class. In other words, in trench 5V, the portion in which first portion 1 of gate electrode EV is embedded has a depth of approximately 6 μm, and the portion in which second portion 13 of gate electrode EV is embedded has a depth of approximately 7 μm. Width W1 of trench 5V is approximately 1 μm, and width W2 thereof is approximately 1.4 μm.

Further, each of n+ source regions 2 and p+ contact regions 3 has a thickness of approximately 1 μm, and p base layer 14 has a thickness of approximately 3 μm.

Figure 6:
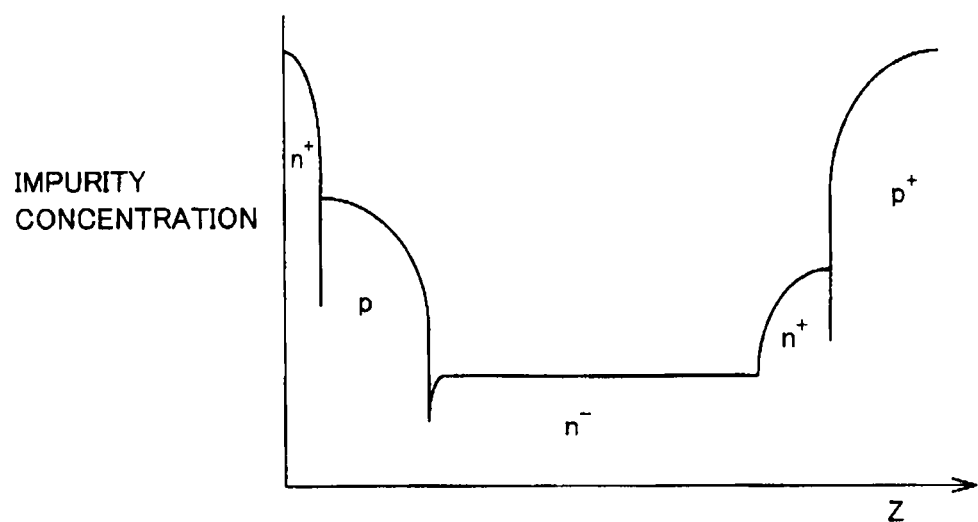
FIG. 6 schematically shows an impurity concentration profile along an arrow VI in FIG. 3.

Referring to FIGS. 3 and 6, peak concentrations in an impurity concentration profile along an arrow VI (FIG. 3) are illustrated as the number of ions per unit volume. The peak concentration in n+ source regions 2 is $1 \times 10^{19}/cm^3$, the peak concentration in p base layer 14 is $5 \times 10^{17}/cm^3$, the peak concentration in n− drift layer 8 is $1.5 \times 10^{14}/cm^3$, the peak concentration in n+ buffer layer 7 is $1 \times 10^{16}/cm^3$, and the peak concentration in p+ collector layer 6 is $1 \times 10^{19}/cm^3$.

Figure 7:
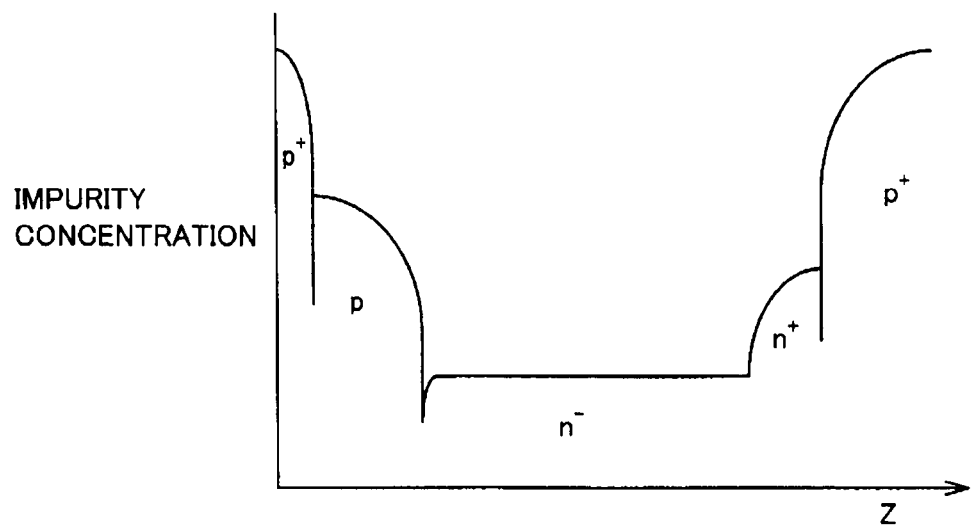
FIG. 7 schematically shows an impurity concentration profile along an arrow VII in FIG. 4.

Referring to FIGS. 4 and 7, peak concentrations in an impurity concentration profile along an arrow VII (FIG. 4) are illustrated as the number of ions per unit volume. The peak concentration in p+ contact regions 3 is $1 \times 10^{19}/cm^3$, the peak concentration in p base layer 14 is $5 \times 10^{17}/cm^3$, the peak concentration in n− drift layer 8 is $1.5 \times 10^{14}/cm^3$, the peak concentration in n+ buffer layer 7 is $1 \times 10^{16}/cm^3$, and the peak concentration in p+ collector layer 6 is $1 \times 10^{19}/cm^3$.

The following schematically describes a method for forming gate electrode EV.

Referring to FIG. 1, the semiconductor layer is first prepared. An etching mask having openings corresponding to a flat pattern of trenches 5V is formed on the semiconductor layer. Then, using the etching mask, the semiconductor layer is etched by, for example, a dry etching method. During the etching, a wider portion in each of the openings is etched deeper than the depth of a narrower portion therein due to a micro-loading effect. In other words, in trench 5V, the portion with width W2 is etched deeper than the depth of the portion with width W1. Specifically, in trench 5V, for example, the portion with width W1=1 μm has a depth of 6 μm, and the portion with width W2=1.4 μm has a depth of 7 μm. As such, the micro-loading effect causes a difference of 1 μm in depth.

Then, to cover the inner wall of trench 5V, gate insulating film 9 is formed. Then, gate electrode EV is formed to bury trench 5V with gate insulating film 9 interposed therebetween.

In this way, as gate electrode EV, first portion 1 having thickness D1 is formed within the portion with width W1 in trench 5V, and second portion 13 having thickness D2 is formed within the portion with width W2 in trench 5V.

The following describes operations of IGBT 101.

The on state of IGBT 101 is first described. In the on state, currents flow from the collector electrode 12 side to the emitter electrode 11 side as indicated by arrows 15 (FIG. 3).

Next, behaviors of the positive hole currents upon turning off IGBT 101 are described. Ideally, upon turning-off, positive hole currents flow into p+ contact regions 3 in the Z direction as indicated by arrows 20d (FIG. 4). However, in practice, positive hole currents flow in a more complicated manner as described below.

Figure 8:
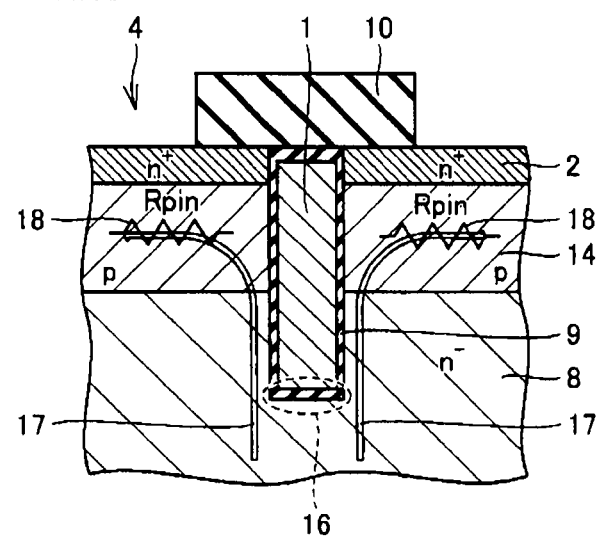
FIGS. 8 and 9 are respective enlarged partial views of FIGS. 3 and 4, showing behaviors of positive hole currents upon turning-off.

Referring to mainly FIG. 8, upon turning-off, positive holes filling n⁻ drift layer 8 are discharged to the emitter electrode 11 (FIG. 3) side by a depletion layer extending from p base layer 14. On this occasion, a part of the positive hole currents passes by the side wall of first portion 1 via the bottom portion of first portion 1 as indicated by arrows 17 due to a strong electric field region 16 appearing at the bottom portion of first portion 1 of gate electrode EV (FIG. 2).

Figure 2:
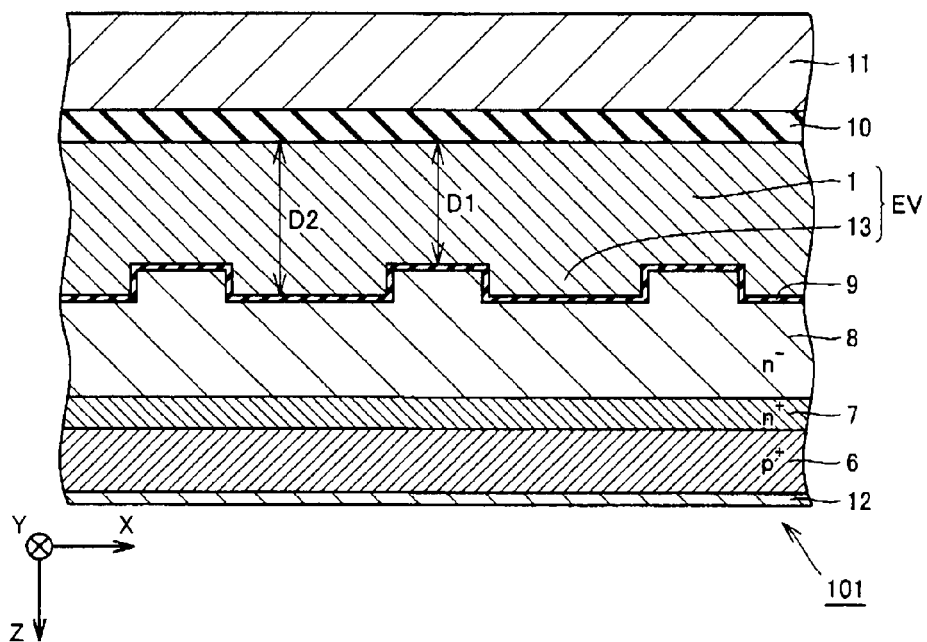
FIGS. 2-5 are schematic partial cross sectional views respectively taken along a line II-II, a line III-III, a line IV-IV, and a line V-V in FIG. 1.
Figure 9:
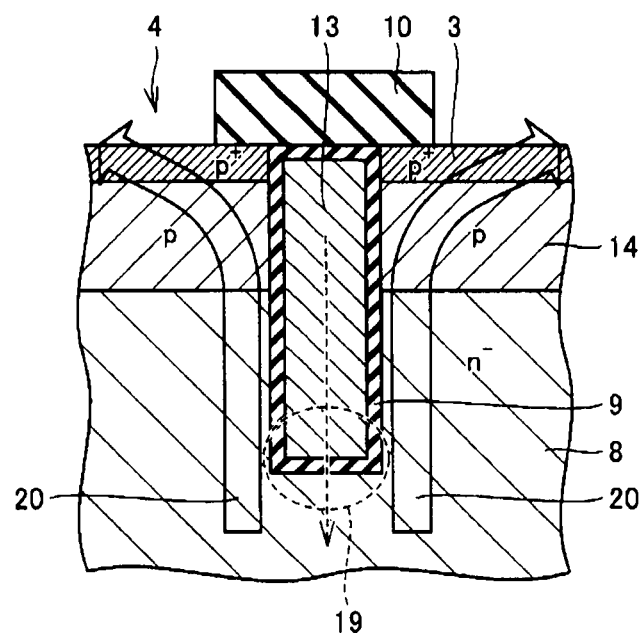

Referring to FIG. 9, another part of the positive hole currents passes by the side wall of second portion 13 via the bottom portion of second portion 13 toward the emitter side as indicated by arrows 20 due to a strong electric field region 19 appearing at the bottom portion of second portion 13 of gate electrode EV (FIG. 2).

Comparing the values of current densities respectively corresponding to arrows 17 (FIG. 8) and arrows 20 (FIG. 9), the value of the current density corresponding to arrows 17 is smaller. This is because first portion 1 of gate electrode EV (FIG. 2) is shallower than second portion 13 thereof and the electric field in strong electric field region 16 is accordingly smaller than the electric field of strong electric field region 19. The following describes results of inspecting a magnitude relation between the electric fields.

Figure 10:
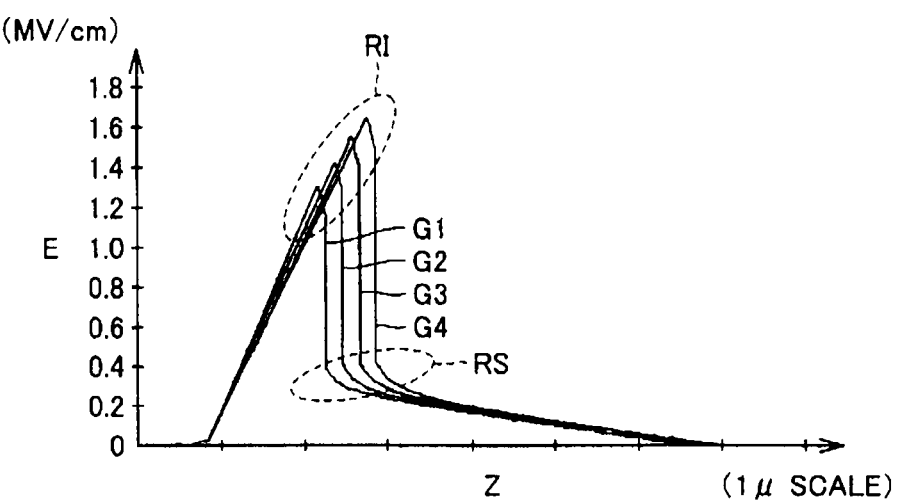
FIG. 10 is a graph showing results of simulating a relation between the depth of a trench of an IGBT and a strength profile of an electric field.

FIG. 10 shows, as strength profiles G1-G4, results of simulating electric field strength E in the Z direction (thickness direction) at a location extending in the Z direction (location extending along the broken line arrow in FIG. 9) in cases where the trench had depths of 1.6 μm, 1.8 μm, 2.0 μm, and 2.2 μm. As a result, both electric field strength RI in gate insulating film 9 and electric field strength RS in n⁻ drift layer 8 at the trench bottom portion were smaller as the trench had a shallower depth.

As described above, since strong electric field region 16 (FIG. 8) has an electric field smaller than that of strong electric field region 19 (FIG. 9), the positive hole currents mainly flow in the paths indicated by arrows 20 (FIG. 9) among the paths indicated by arrows 17 (FIG. 8) and 20 upon turning-off. Namely, the difference in electric field strength therebetween reduces positive hole currents flowing in the paths indicated by arrows 17.

Figure 5:
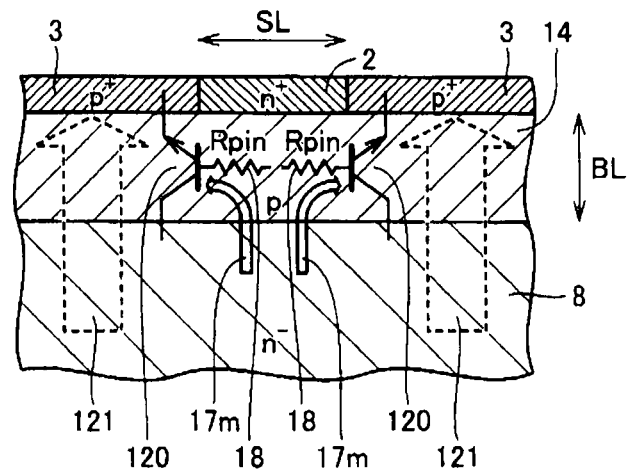

Referring to FIG. 5, as indicated by arrows 17m, the positive hole currents having flowed in the paths indicated by arrows 17 (FIG. 8) flow in a silicon mesa region, i.e., a region sandwiched between a pair of trenches 5V (FIG. 1) and extending as long as an n⁺ source length SL. The currents flow in parasitic npn transistors 120, to the emitter side via a base region having a p base length BL. In other words, the currents contribute to base currents of parasitic npn transistors 120.

If the base currents are too large, a latch-up current 121 flows from the collector side to the emitter side in each of parasitic npn transistors 120. In other words, latch-up occurs. Particularly, when pinch resistances 18 (Rpin) are large, each of parasitic npn transistors 120 has a large amplification factor $h_{FE}$, which may result in breakage caused by latch-up.

However, according to the present embodiment, since the positive hole currents flowing in the paths indicated by arrows 17 (FIG. 8) are small as described above, the currents keeping on flowing as indicated by arrows 17, i.e., the positive hole currents flowing in the paths indicated by arrows 17m (FIG. 5) are small. This restricts the base current flowing in parasitic npn transistor 120, thereby preventing latch-up of IGBT 101.

It should be noted that the positive hole currents indicated by arrows 20 flow in regions in which parasitic npn transistors 120 are not formed, and are discharged to the emitter side. Hence, they do not cause latch-up.

The following describes an IGBT 100 of a comparative example.

Figure 11:
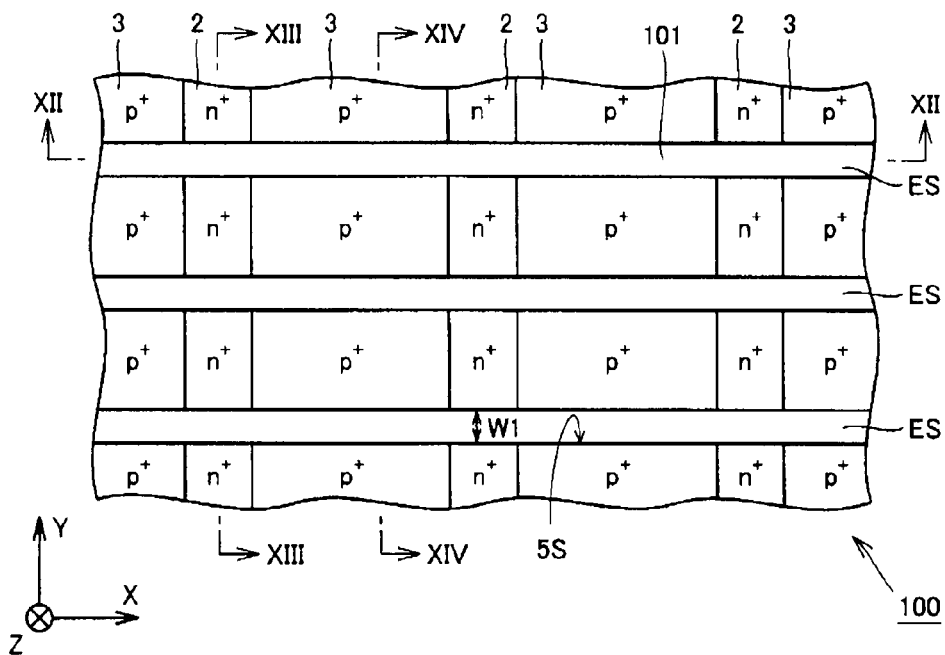
FIG. 11 is a partial plan view schematically showing a configuration of a power semiconductor device of a comparative example.

Referring to FIG. 11, IGBT 100 of the comparative example has a semiconductor layer in which trenches 5S are formed. All the trenches 5S have a width W1. In other words, trenches 5S have a uniform width.

Figure 12:
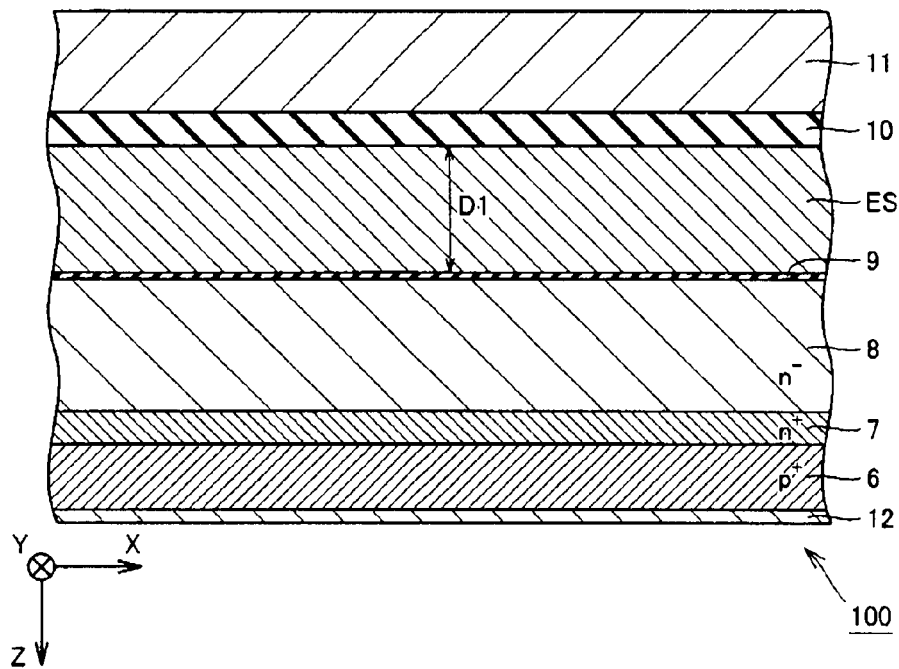
FIGS. 12-14 are schematic partial cross sectional views respectively taken along a line XII-XII, a line XIII-XIII, and a line XIV-XIV in FIG. 11.
Figure 13:
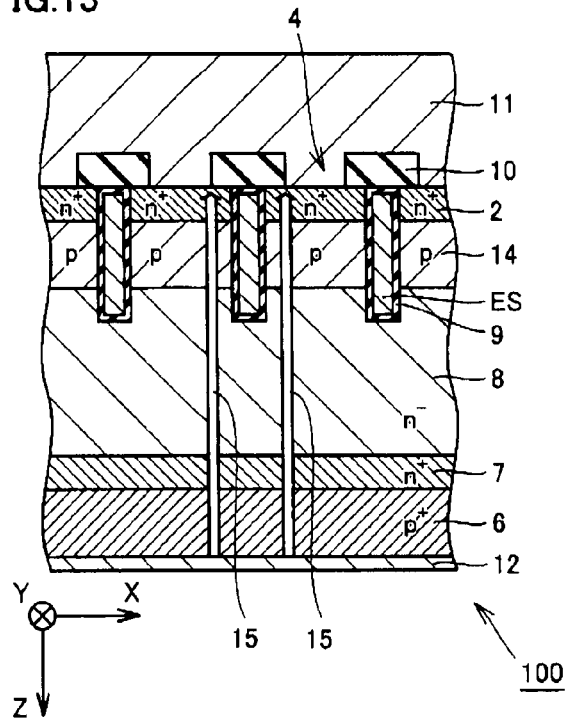
Figure 14:
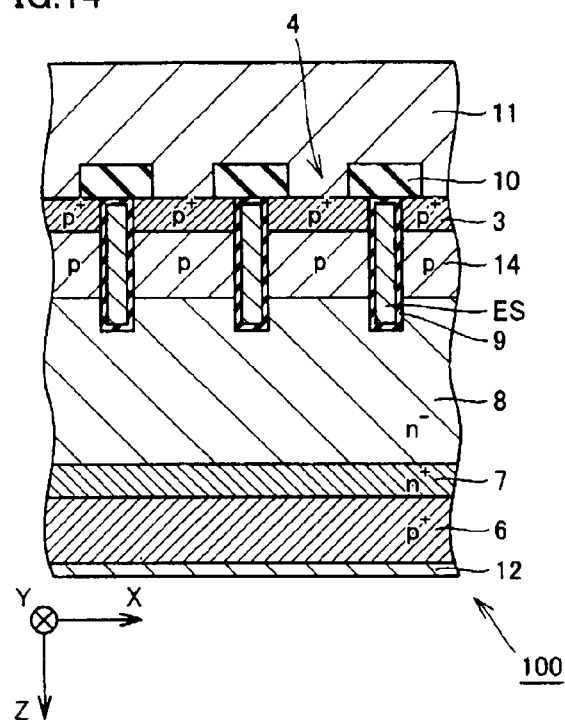

Referring to FIGS. 12-14, a gate electrode ES is embedded in each of trenches 5S (FIG. 11) with a gate insulating film 9 interposed therebetween. Entire gate electrode ES has a thickness D1 (FIG. 12). In other words, gate electrode ES has a uniform thickness.

Figure 15:
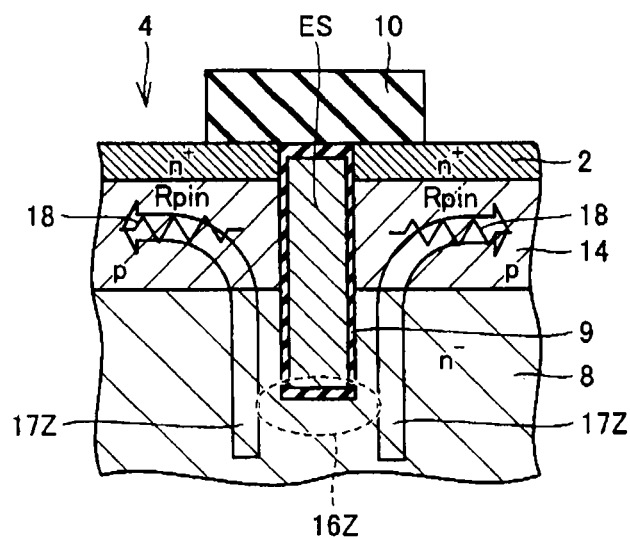
FIGS. 15 and 16 are respective enlarged partial views of FIGS. 13 and 14, showing behaviors of positive hole currents upon turning-off.
Figure 16:
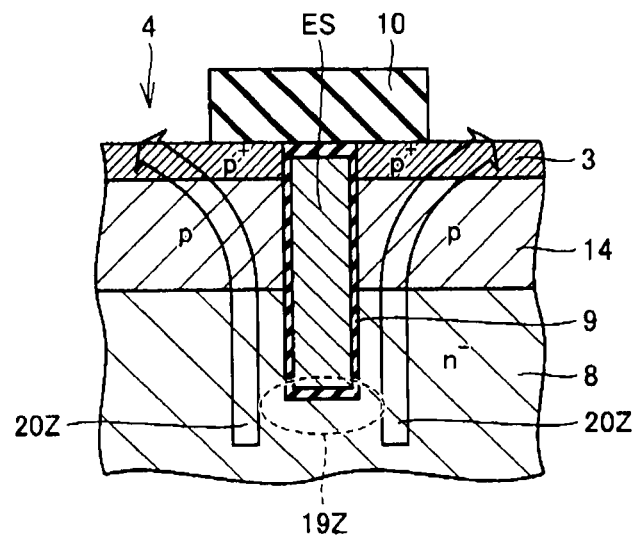

Referring to FIGS. 15 and 16, the uniform thicknesses described above provide substantially the same strong electric field regions 16Z (FIG. 15) and 19Z (FIG. 16). Accordingly, upon turning-off, large positive hole currents flow not only in the paths indicated by arrows 20Z (FIG. 16) but also in paths indicated by arrows 17Z (FIG. 15). As a result, base currents in parasitic npn transistors 120 (FIG. 5) are too large, whereby IGBT 100 is likely to be latched up.

Particularly when turning-off time is fast, i.e., when time differential of collector-emitter voltage (dV/dt) is large, the positive hole currents are not discharged smoothly to the emitter side and positive holes are therefore concentrated in p base layer 14. Accordingly, IGBT 100 is likely to be broken. Similarly, when a collector current is large, density of carriers stored in n⁻ drift layer 8 is large, resulting in a large positive hole current upon turning-off. Accordingly, IGBT 100 is likely to be broken.

If only restraint of occurrence of latch-up is intended, pinch resistances 18 (FIG. 15) of IGBT 100 are reduced. It is considered that there are three measures for restraining occurrence of latch-up, for example, as follows. The first measure is to reduce n⁺ source length SL. The second measure is to make p base length BL longer. The third measure is to increase the impurity concentration of p base layer 14. The first measure requires more advanced microfabrication technique. In addition, if reduced n⁺ source length SL is too short, the threshold voltage and on voltage vary greatly. As to the second measure, channel resistance is increased to result in increased on voltage. As to the third measure, the threshold voltage is increased. Thus, such attempts to prevent occurrence of latch-up of IGBT 100 using these simple measures will provide adverse effects to the basic characteristics of the device.

In contrast, according to IGBT 101 of the present embodiment, latch-up can be prevented without depending on adjustment of n⁺ source length SL, p base length BL, or the impurity concentration in p base layer 14. In other words, occurrence of latch-up can be prevented while avoiding the above-described adverse effects on the basic characteristics of the device.

By applying the micro-loading effect, trench 5V having portions with different depths can be formed through a single trench etching.

Although the present embodiment has dealt with an IGBT, the same effect as that in the present embodiment can be attained in a MOSFET by employing a structure obtained by removing p⁺ collector layer 6 from the structure of IGBT 101 (FIGS. 2-4).

Second Embodiment

Figure 17:
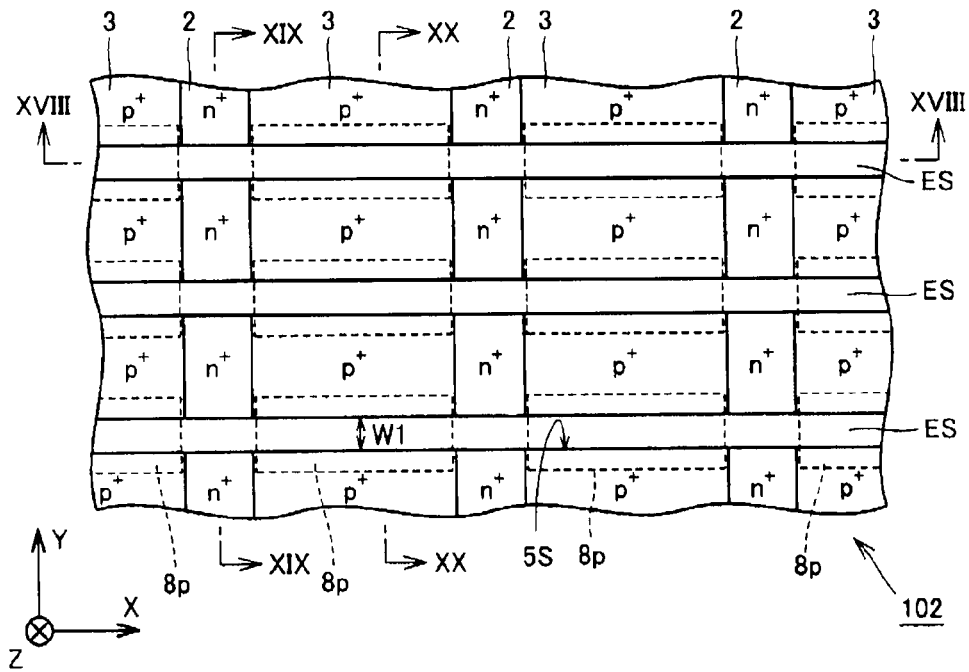
FIG. 17 is a partial plan view schematically showing a configuration of a power semiconductor device of a second embodiment of the present invention.

Referring to FIGS. 17-20, a configuration of an IGBT 102 will be described which serves as a power semiconductor device of the present embodiment. FIG. 17 shows a transistor cell of IGBT 102 when viewed from the emitter side. For visibility in FIG. 17, an emitter electrode 11, an interlayer insulating film 10, and a gate insulating film 9 are not shown therein.

IGBT 102 has a collector electrode 12 (first electrode), emitter electrode 11 (second electrode), gate insulating film 9, a gate electrode ES, interlayer insulating film 10, and a semiconductor layer. The semiconductor layer is formed on collector electrode 12, and has a $p^+$ collector layer 6 (fourth layer) of p type (second conductive type), an $n^+$ buffer layer 7 of n type (first conductive type), a drift layer 8V (first layer) of n type, a p base layer 14 (second layer) of p type (second conductive type), and a third layer. The third layer has $n^+$ source regions 2 (first regions) of n type, and $p^+$ contact regions 3 (second regions) of p type.

Figure 18:
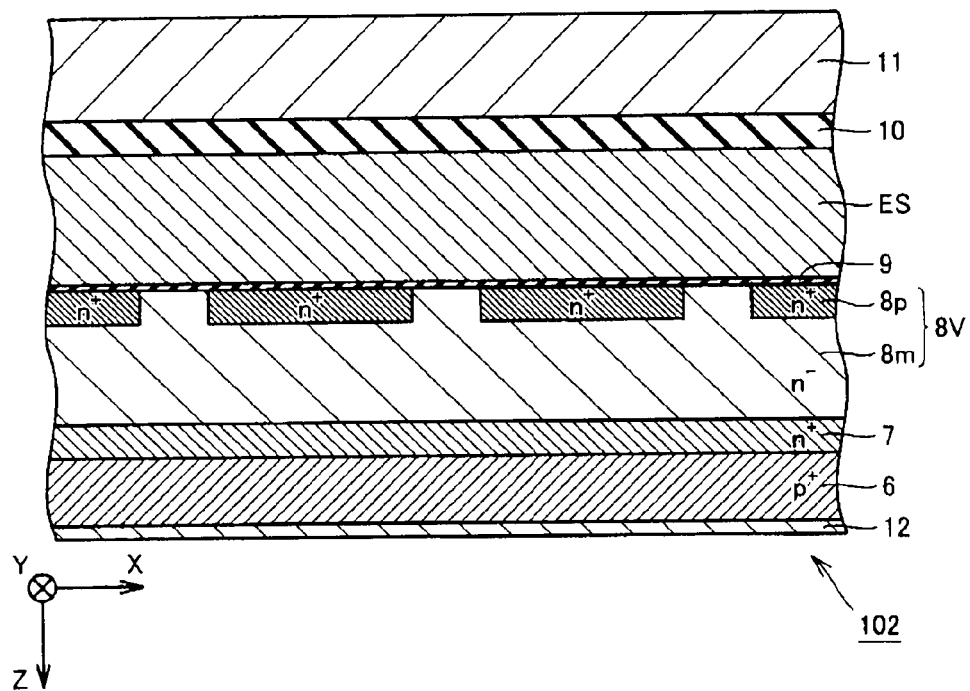
FIGS. 18-20 are schematic partial cross sectional views respectively taken along a line XVIII-XVIII, a line XIX-XIX, and a line XX-XX in FIG. 17.

Drift layer 8V is provided on $n^+$ buffer layer 7. In other words, drift layer 8V is provided over collector electrode 12 with $p^+$ collector layer 6 and $n^+$ buffer layer 7 interposed therebetween. Drift layer 8V has a low concentration region 8m (first low concentration region) and high concentration regions 8p (first high concentration regions). As shown in FIG. 18, each of high concentration regions 8p is embedded in low concentration region 8m at a side closer to emitter electrode 11, and has an impurity concentration higher than that of low concentration region 8m.

In the present embodiment, high concentration region 8p has a thickness of, for example, 7 μm. High concentration region 8p can be formed by, for example, injecting phosphorus with a high energy of MeV level, using a mask pattern.

P base layer 14 is formed on drift layer 8V.

On the semiconductor layer at a surface (surface shown in FIG. 17) opposite to the surface facing collector electrode 12, there are formed trenches 5S each having a width W1. Gate insulating film 9 covers the inner wall of each of trenches 5S. Gate electrode ES is embedded in trench 5S with gate insulating film 9 interposed therebetween.

Gate electrode ES includes first portions (portions shown in FIG. 19) each projecting into drift layer 8V through $n^+$ source regions 2 and p base layer 14, and second portions (portions shown in FIG. 20) projecting into drift layer 8V through $p^+$ contact regions 3 and p base layer 14. The first and second portions are formed in one piece. Namely, when viewed in a planar view, gate electrode ES is provided to transverse the striped arrangement of $n^+$ source regions 2 and $p^+$ contact regions 3. In this way, $n^+$ source regions 2 and $p^+$ contact regions 3 are configured to have the same potential.

The first portions (portions shown in FIG. 19) of gate electrode ES are not in direct contact with but are covered with high concentration region 8p of drift layer 8V with gate insulating film 9 interposed therebetween. The second portions (portions shown in FIG. 20) of gate electrode ES are covered with high concentration regions 8p of drift layer 8V, with gate insulating film 9 interposed therebetween. High concentration regions 8p are covered with low concentration region 8m.

Figure 19:
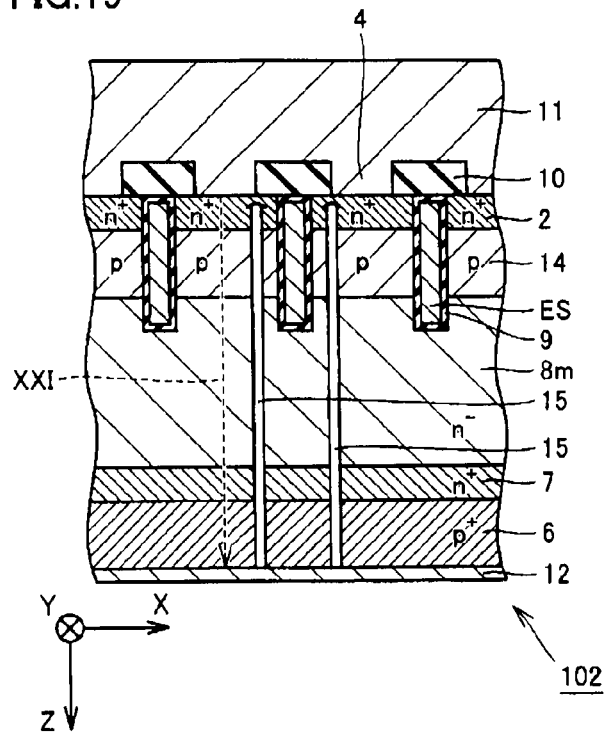
Figure 20:
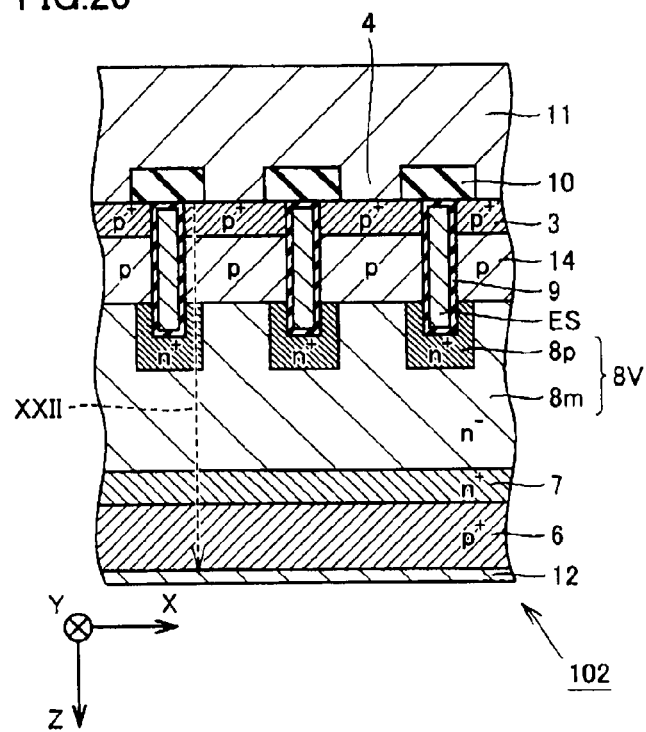

Emitter electrode 11 is in contact with each of $n^+$ source regions 2 and $p^+$ contact regions 3 at the location of an emitter contact 4 (FIGS. 19, 20). Emitter electrode 11 is insulated from gate electrode ES by interlayer insulating film 10.

Figure 21:
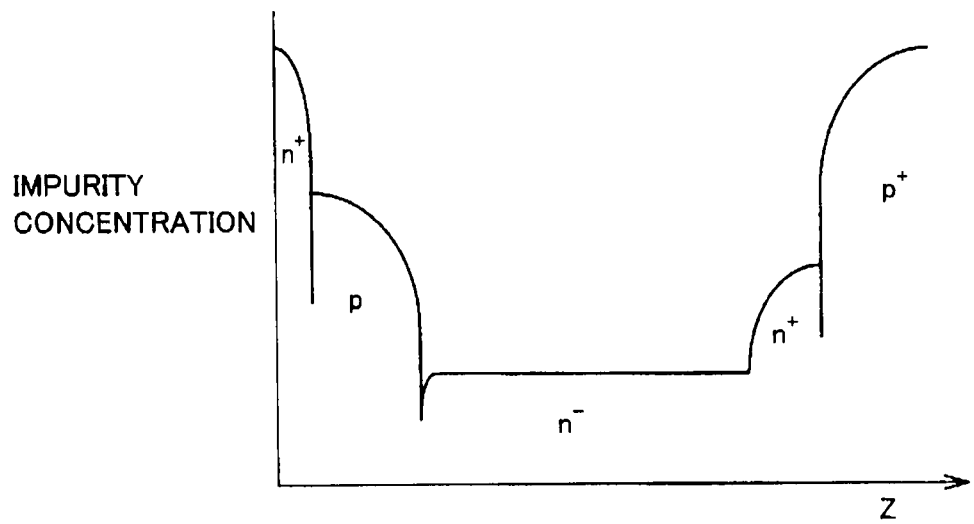
FIGS. 21 and 22 schematically show impurity concentration profiles along an arrow XXI in FIG. 19 and an arrow XXII in FIG. 20, respectively.

Referring to FIGS. 19 and 21, peak concentrations in an impurity concentration profile along an arrow XXI (FIG. 19) are illustrated as the number of ions per unit volume. The peak concentration in $n^+$ source regions 2 is $1 \times 10^{19}/cm^3$, the peak concentration in p base layer 14 is $5 \times 10^{17}/cm^3$, the peak concentration in low concentration region 8m of drift layer 8V is $1.5 \times 10^{14}/cm^3$, the peak concentration in $n^+$ buffer layer 7 is $1 \times 10^{16}/cm^3$, and the peak concentration in $p^+$ collector layer 6 is $1 \times 10^{19}/cm^3$.

Figure 22:
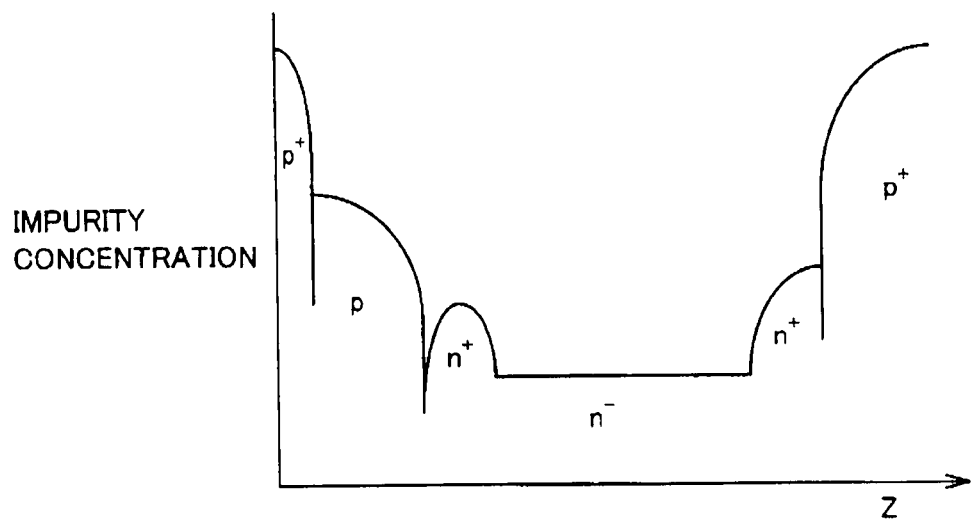

Referring to FIGS. 20 and 22, peak concentrations in an impurity concentration profile along an arrow XXII (FIG. 20) are illustrated as the number of ions per unit volume. The peak concentration in $p^+$ contact regions 3 is $1 \times 10^{19}/cm^3$, the peak concentration in p base layer 14 is $5 \times 10^{17}/cm^3$, the peak concentration in high concentration regions 8p of drift layer 8V is $1 \times 10^{15}/cm^3$, the peak concentration in low concentration region 8m of drift layer 8V is $1.5 \times 10^{14}/cm^3$, the peak concentration in $n^+$ buffer layer 7 is $1 \times 10^{16}/cm^3$, and the peak concentration in $p^+$ collector layer 6 is $1 \times 10^{19}/cm^3$.

Configurations other than those described above are substantially the same as those of the foregoing first embodiment. Hence, the same or corresponding elements are given the same reference characters and will not be described repeatedly.

Figure 23:
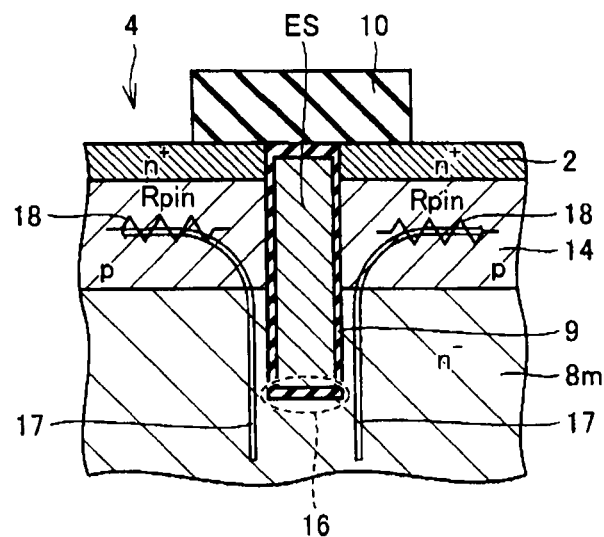
FIGS. 23 and 24 are respective enlarged partial views of FIGS. 19 and 20, showing behaviors of positive hole currents upon turning-off.
Figure 24:
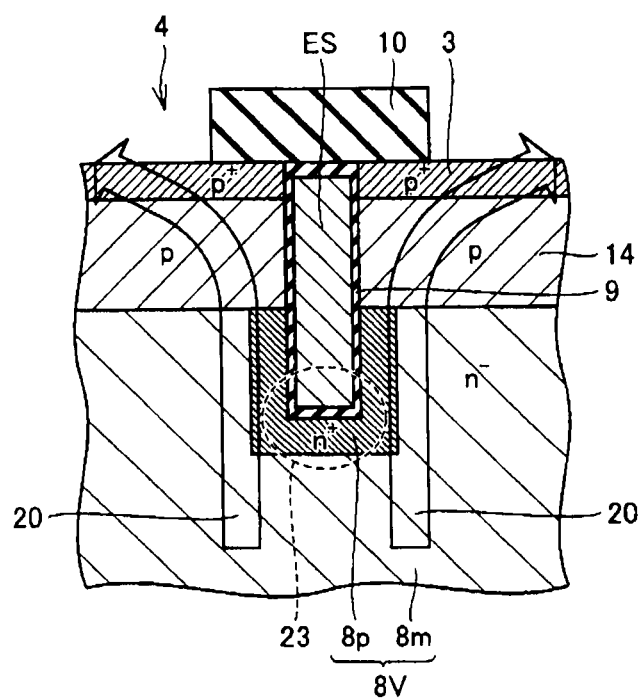

According to the present embodiment, in trenches 5S (FIG. 17), high concentration regions 8p are provided only at the bottoms of portions (portions shown in FIG. 20) projecting through $p^+$ contact regions 3. Accordingly, strong electric field region 16 (FIG. 23) has an electric field smaller than that of strong electric field region 23 (FIG. 24). Hence, the positive hole currents upon turning-off mainly flow in paths indicated by arrows 20 (FIG. 24) among paths indicated by arrows 17 (FIG. 23) and 20. Namely, the difference in electric field strength therebetween reduces positive hole currents flowing in the paths indicated by arrows 17. As a result, the same effect as that of the first embodiment can be obtained. In other words, latch-up of IGBT 102 is prevented.

Although the present embodiment has dealt with an IGBT, the same effect as that in the present embodiment can be attained in a MOSFET by employing a structure obtained by removing $p^+$ collector layer 6 from the structure of IGBT 102.

Third Embodiment

Figure 25:
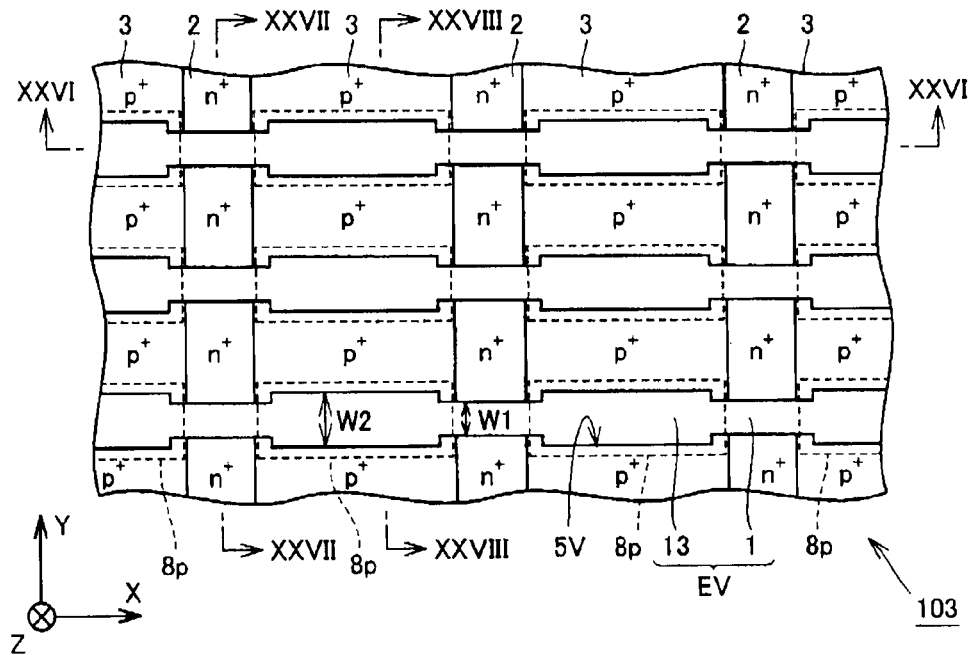
FIG. 25 is a partial plan view schematically showing a configuration of a power semiconductor device of a third embodiment of the present invention.
Figure 26:
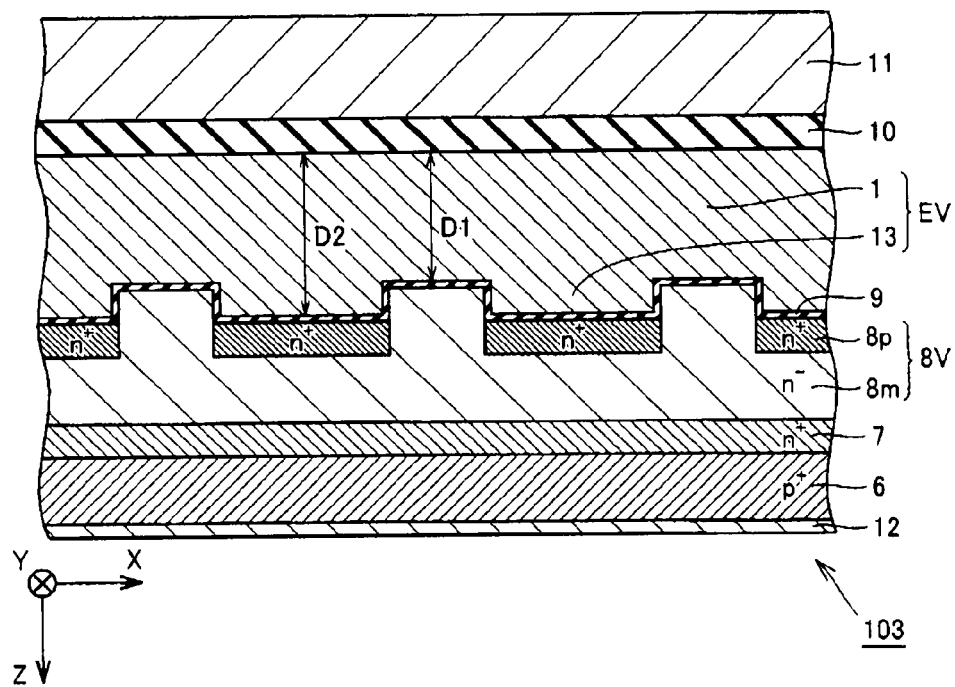
FIGS. 26-28 are schematic partial cross sectional views respectively taken along a line XXVI-XXVI, a line XXVII-XXVII, and a line XXVIII-XXVIII in FIG. 25.
Figure 27:
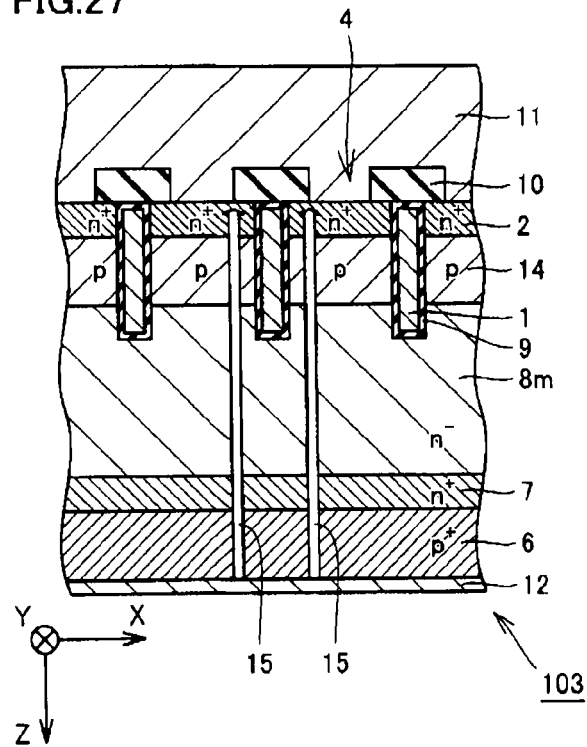
Figure 28:
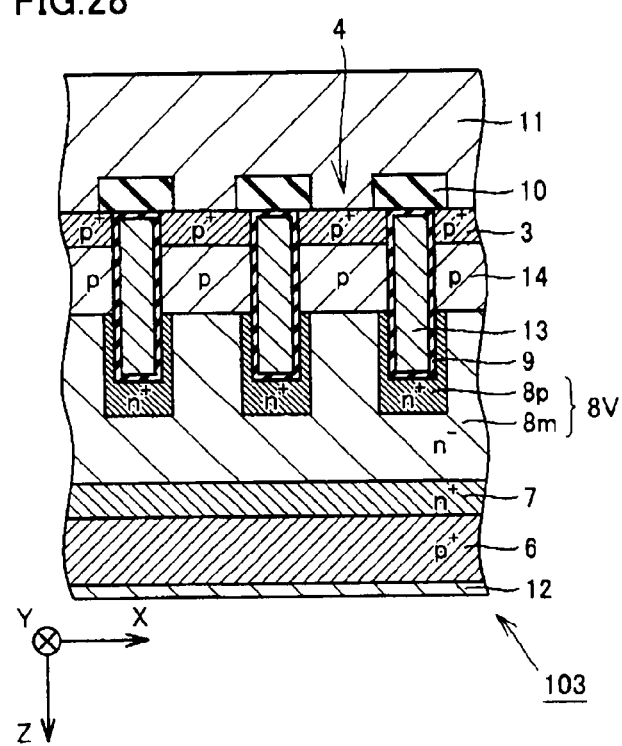

Referring to FIGS. 25-28, a configuration of an IGBT 103 will be described which serves as a power semiconductor device of the present embodiment. FIG. 25 shows a transistor cell of IGBT 103 when viewed from the emitter side. For visibility in FIG. 25, an emitter electrode 11, an interlayer insulating film 10, and a gate insulating film 9 are not shown therein.

IGBT 103 has a collector electrode 12 (first electrode), emitter electrode 11 (second electrode), gate insulating film 9, a gate electrode EV, interlayer insulating film 10, and a semiconductor layer. The semiconductor layer is provided on collector electrode 12, and has a $p^+$ collector layer 6 (fourth layer) of p type (second conductive type), $n^+$ buffer layer 7 of n type (first conductive type), drift layer 8V (first layer) of n type, p base layer 14 (second layer) of p type (second conductive type), and a third layer. The third layer has $n^+$ source regions 2 (first regions) of n type, and $p^+$ contact region 3 (second region) of p type.

Gate electrode EV has first portions 1 (portions shown in FIG. 27) are not in direct contact with but are covered with high concentration region 8p of drift layer 8V with gate insulating film 9 interposed therebetween. Gate electrode EV has second portions 13 (portions shown in FIG. 28) covered with high concentration regions 8p (first high concentration regions) of drift layer 8V, with gate insulating film 9 interposed therebetween. Each of high concentration regions 8p is covered with low concentration region 8m (first low concentration region).

In the present embodiment, high concentration region 8p has a thickness of, for example, 8 μm. High concentration region 8p can be formed by, for example, injecting phosphorus with a high energy of MeV level, using a mask pattern.

Configurations other than those described above are substantially the same as those of the foregoing first or second embodiment. Hence, the same or corresponding elements are given the same reference characters and will not be described repeatedly.

According to the present embodiment, the same effect as those in the first and second embodiments can be obtained.

Fourth Embodiment

Figure 29:
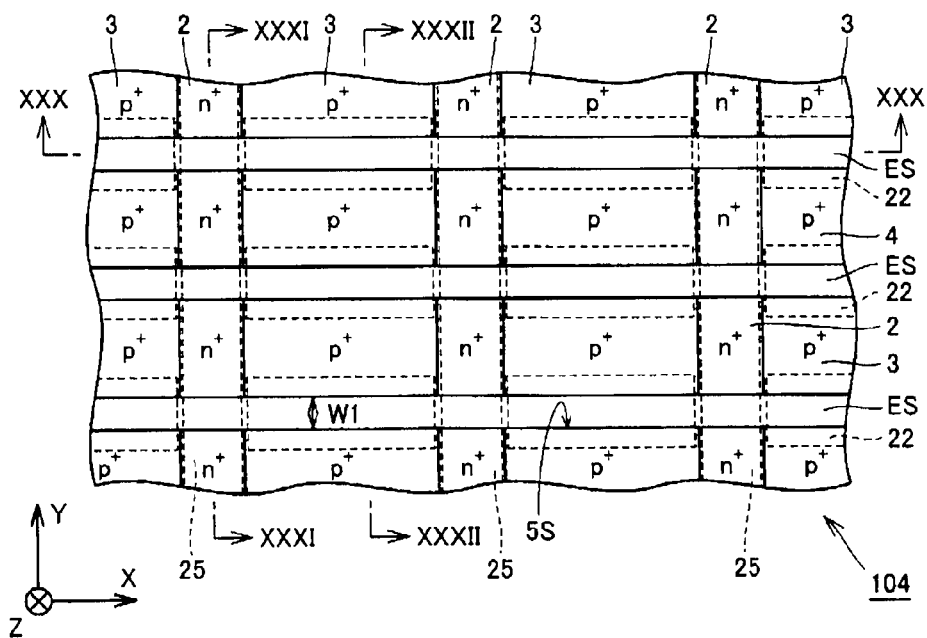
FIG. 29 is a partial plan view schematically showing a configuration of a power semiconductor device of a fourth embodiment of the present invention.
Figure 30:
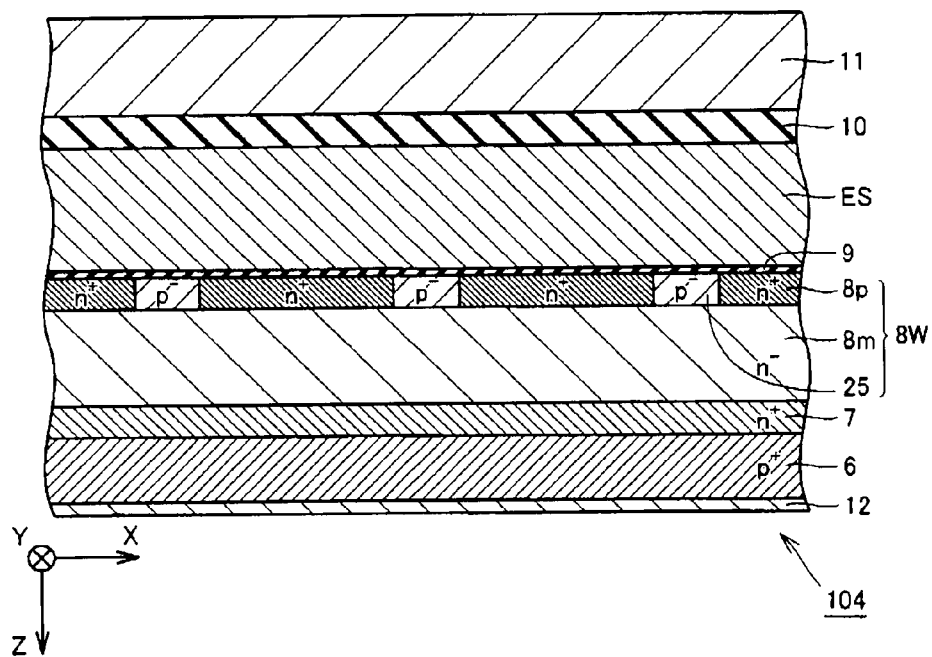
FIGS. 30-32 are schematic partial cross sectional views respectively taken along a line XXX-XXX, a line XXXI-XXXI, and a line XXXII-XXXII in FIG. 29.

Referring to FIGS. 29-34, a configuration of an IGBT 104 will be described which serves as a power semiconductor device of the present embodiment. FIG. 29 shows a transistor cell of IGBT 104 when viewed from the emitter side. For visibility in FIG. 29, an emitter electrode 11, an interlayer insulating film 10, and a gate insulating film 9 are not shown therein.

IGBT 104 has a collector electrode 12 (first electrode), emitter electrode 11 (second electrode), gate insulating film 9, a gate electrode ES, an interlayer insulating film 10, and a semiconductor layer. The semiconductor layer is provided on collector electrode 12, and has a p$^+$ collector layer 6 (fourth layer) of p type (second conductive type), an n$^+$ buffer layer 7 of n type (first conductive type), a drift layer 8W (first layer), a p base layer 14 (second layer) of p type (second conductive type), and a third layer. The third layer has n$^+$ source regions 2 (first regions) of n type, and p$^+$ contact regions 3 (second regions) of p type.

Figure 32:
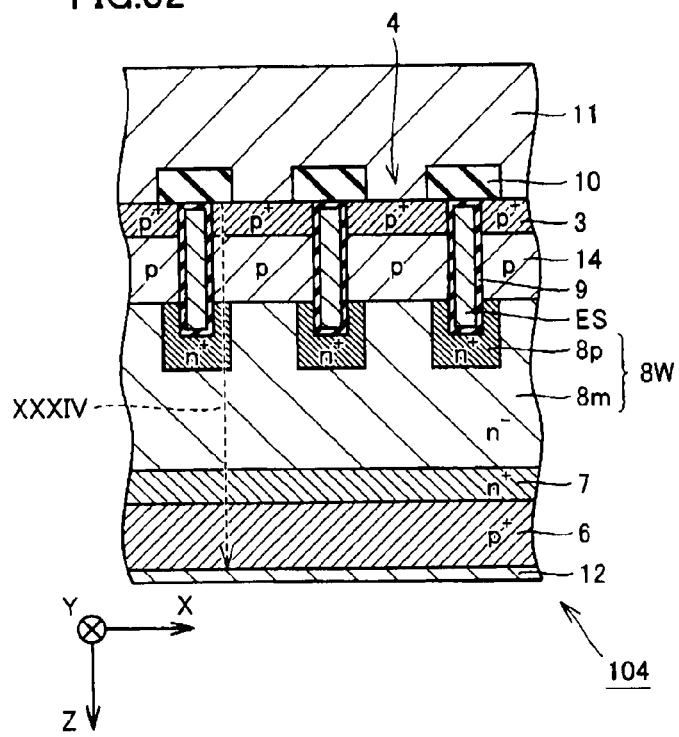

Drift layer 8W is provided on n$^+$ buffer layer 7. In other words, drift layer 8W is provided over collector electrode 12 with p$^+$ collector layer 6 and n$^+$ buffer layer 7 interposed therebetween. Drift layer 8W has a low concentration region 8m (first low concentration region) of n type, high concentration regions 8p (first high concentration regions) of n type, and low concentration regions 25 of p type. As shown in FIG. 32, each of high concentration regions 8p is embedded in low concentration region 8m at a side closer to emitter electrode 11, and has an impurity concentration higher than that of low concentration region 8m.

Figure 31:
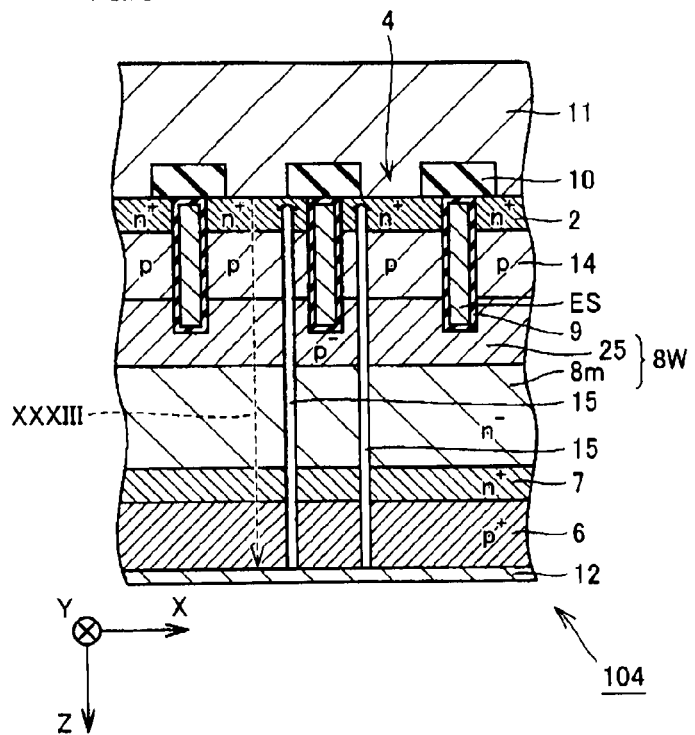

As shown in FIG. 31, each of low concentration regions 25 is provided in low concentration region 8m at a side closer to emitter electrode 11, and has an impurity concentration smaller than that of p base layer 14. Low concentration region 25 can be formed by, for example, injecting boron with a high energy of MeV level, using a mask pattern.

P base layer 14 is provided on drift layer 8W.

Gate electrode ES includes first portions (portions shown in FIG. 31) each projecting into drift layer 8W through n$^-$ source regions 2 and p base layer 14, and second portions (portions shown in FIG. 32) projecting into drift layer 8W through p$^+$ contact regions 3 and p base layer 14. The first and second portions are formed in one piece. Namely, when viewed in a planar view, gate electrode ES is provided to transverse the striped arrangement of n$^+$ source regions 2 and p$^+$ contact regions 3. In this way, n$^+$ source regions 2 and p$^+$ contact regions 3 are configured to have the same potential.

The second portions (portions shown in FIG. 32) of gate electrode ES are covered with high concentration regions 8p of drift layer 8W, with gate insulating film 9 interposed therebetween. High concentration regions 8p are covered with low concentration region 8m. The first portions (portions shown in FIG. 31) of gate electrode ES are covered with low concentration regions 25 of drift layer 8W, with gate insulating film 9 interposed therebetween.

Figure 33:
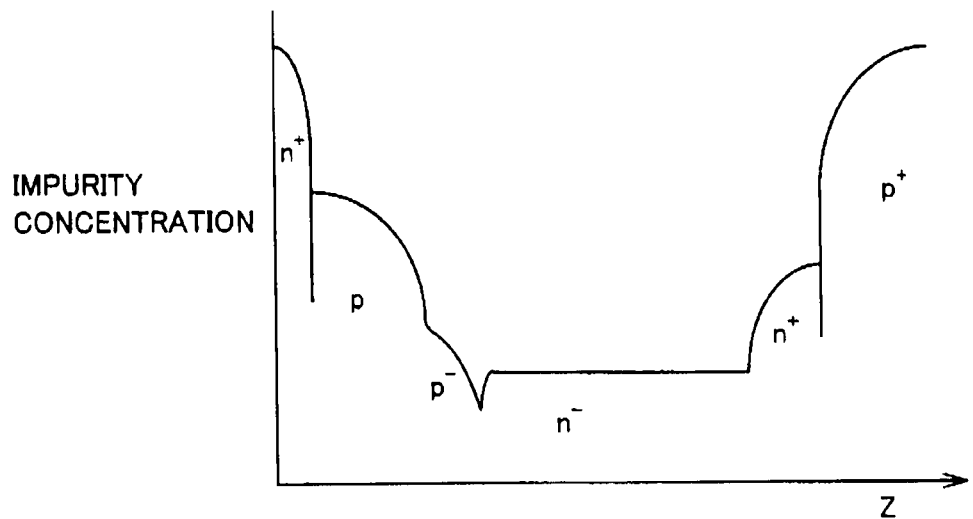
FIGS. 33 and 34 schematically show impurity concentration profiles along an arrow XXXIII in FIG. 31 and an arrow XXXIV in FIG. 32, respectively.

Referring to FIGS. 31 and 33, peak concentrations in an impurity concentration profile along an arrow XXXIII (FIG. 31) are illustrated as the number of ions per unit volume. The peak concentration in n$^+$ source regions 2 is $1\times10^{19}$/cm$^3$, the peak concentration in p base layer 14 is $5\times10^{17}$/cm$^3$, the peak concentration in low concentration regions 25 of drift layer 8W is $3\times10^{14}$/cm$^3$, the peak concentration in low concentration region 8m of drift layer 8W is $1.5\times10^{14}$/cm$^3$, the peak concentration in n$^+$ buffer layer 7 is $1\times10^{16}$/cm$^3$, and the peak concentration in p$^+$ collector layer 6 is $1\times10^{19}$/cm$^3$.

Figure 34:
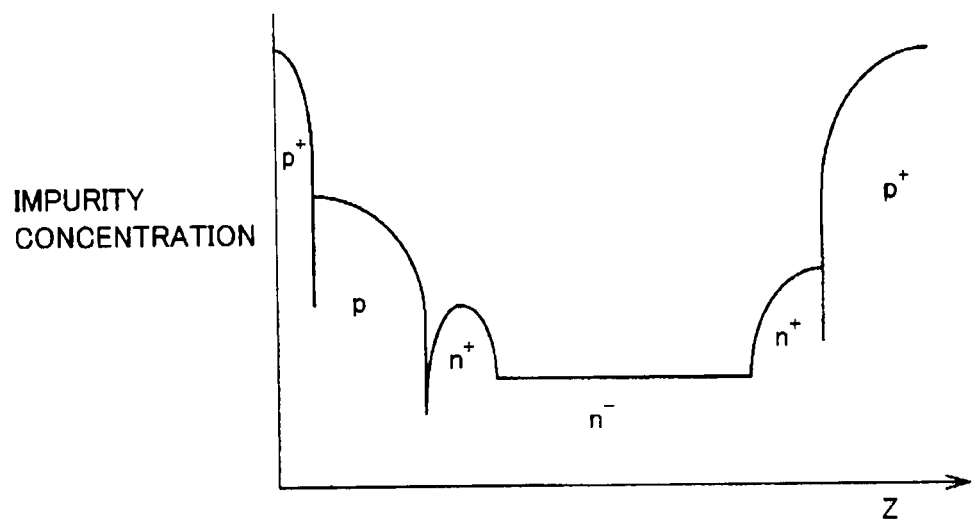

Referring to FIGS. 32 and 34, peak concentrations in an impurity concentration profile along an arrow XXXIV (FIG. 32) are illustrated as the number of ions per unit volume. The peak concentration in p$^+$ contact regions 3 is $1\times10^{19}$/cm$^3$, the peak concentration in p base layer 14 is $5\times10^{17}$/cm$^3$, the peak concentration in high concentration region 8p of drift layer 8W is $1\times10^{15}$/cm$^3$, the peak concentration in low concentration region 8m of drift layer 8W is $1.5\times10^{14}$/cm$^3$, the peak concentration in n$^+$ buffer layer 7 is $1\times10^{16}$/cm$^3$, and the peak concentration in p$^+$ collector layer 6 is $1\times10^{19}$/cm$^3$.

Configurations other than those described above are substantially the same as those of the foregoing second embodiment. Hence, the same or corresponding elements are given the same reference characters and will not be described repeatedly.

According to the present embodiment, the same effect as that of the second embodiment can be obtained. Further, since the first portions (portions shown in FIG. 31) of gate electrode ES are covered with low concentration regions 25, the channel length has become longer. Thus, the electric field at the bottom portion of the trench can be alleviated upon turning-off without increasing the on voltage.

Although the present embodiment has dealt with an IGBT, the same effect as that in the present embodiment can be attained in a MOSFET by employing a structure obtained by removing p$^+$ collector layer 6 from the structure of IGBT 104.

Fifth Embodiment

Figure 35:
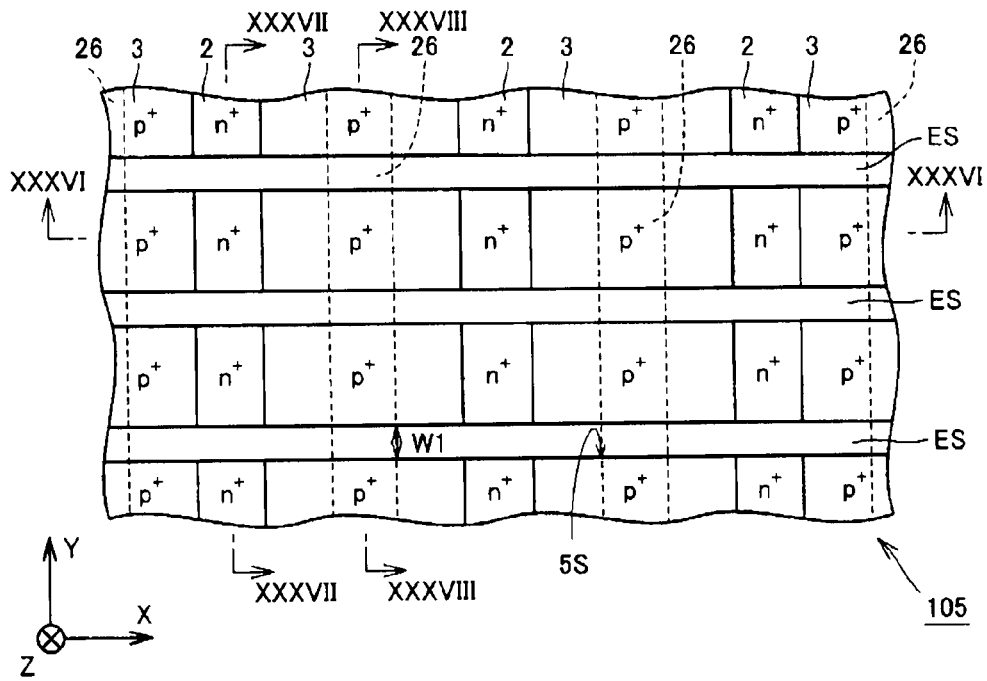
FIG. 35 is a partial plan view schematically showing a configuration of a power semiconductor device of a fifth embodiment of the present invention.

Referring to FIGS. 35-38, a configuration of an IGBT 105 will be described which serves as a power semiconductor device of the present embodiment. FIG. 35 shows a transistor cell of IGBT 105 when viewed from the emitter side. For visibility in FIG. 35, an emitter electrode 11, an interlayer insulating film 10, and a gate insulating film 9 are not shown therein.

IGBT 105 has a collector electrode 12 (first electrode), emitter electrode 11 (second electrode), gate insulating film 9, a gate electrode ES, interlayer insulating film 10, and a semiconductor layer. The semiconductor layer is provided on collector electrode 12, and has a p$^+$ collector layer 6 (fourth layer) of p type (second conductive type), an n$^+$ buffer layer 7 of n type (first conductive type), a drift layer 8 (first layer) of n type, a p base layer 14V (second layer) of p type (second conductive type), and a third layer. The third layer has n' source regions 2 (first regions) of n type, and p$^+$ contact regions 3 (second regions) of p type.

P base layer 14V is provided on drift layer 8, and has normal concentration base regions 14n (normal concentration regions) and high concentration base regions 14p (second high concentration regions). High concentration base regions 14p have an impurity concentration higher than that of normal concentration base regions 14n.

Figure 36:
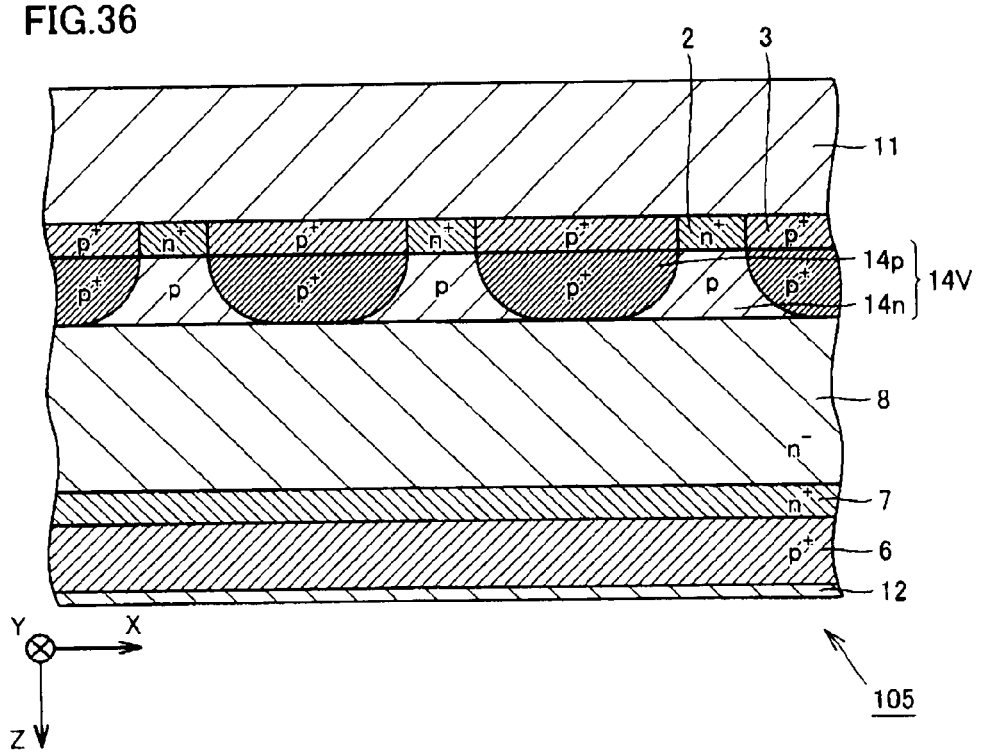
FIGS. 36-38 are schematic partial cross sectional views respectively taken along a line XXXVI-XXXVI, a line XXXVII-XXXVII, and a line XXXVIII-XXXVIII in FIG. 35.

As shown in FIG. 36, normal concentration base regions 14n and high concentration base regions 14p are provided just below n+ source regions 2 and p+ contact regions 3 respectively in the semiconductor layer. In other words, normal concentration base regions 14n and high concentration base regions Hp are formed in the form of stripes, as with n+ source regions 2 and p+ contact regions 3.

More specifically, normal concentration base regions 14n and high concentration base regions 14p have, at their emitter sides, flat shapes similar to those of source regions 2 and p+ contact regions 3. In addition, p base layer 14V has such a shape that normal concentration base regions 14n gradually eat away high concentration base regions 14p from its emitter side toward its collector side. Such high concentration base regions 14p can be formed by, for example, injecting boron with an energy of 150 keV, using a mask pattern having an opening 26 (FIG. 35).

On the semiconductor layer at a surface opposite to the surface facing collector electrode 12 (surface shown in FIG. 35), there are formed trenches 5S each having a width W1. Gate insulating film 9 covers the inner wall of each of trenches 5S. Gate electrode ES is embedded in trench 5S with gate insulating film 9 interposed therebetween.

Gate electrode ES includes first portions (portions shown in FIG. 37) projecting into drift layer 8 through n+ source regions 2 and normal concentration base regions 14n, and second portions (portions shown in FIG. 38) projecting into drift layer 8 through p+ contact regions 3 and high concentration base regions 14p. The first and second portions are formed in one piece. Namely, when viewed in a planer view, gate electrode ES is provided to transverse the striped arrangement of n+ source regions 2 and p+ contact regions 3. In this way, n+ source regions 2 and p+ contact regions 3 are configured to have the same potential.

The first portions (portions shown in FIG. 37) of gate electrode ES are covered with normal concentration base regions 14n, with gate insulating film 9 interposed therebetween. The second portions (portions shown in FIG. 38) of gate electrode ES are covered with high concentration base regions 14p, with gate insulating film 9 interposed therebetween.

Figure 37:
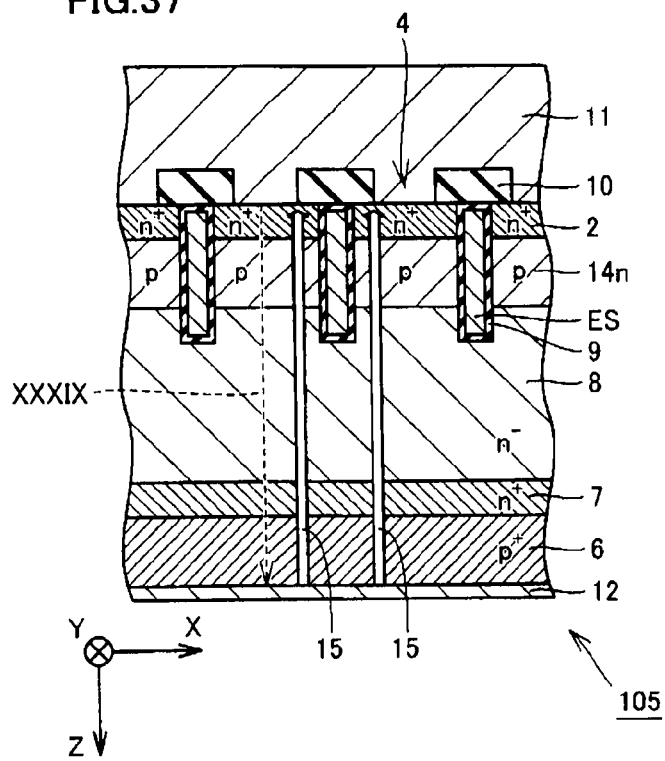
Figure 39:
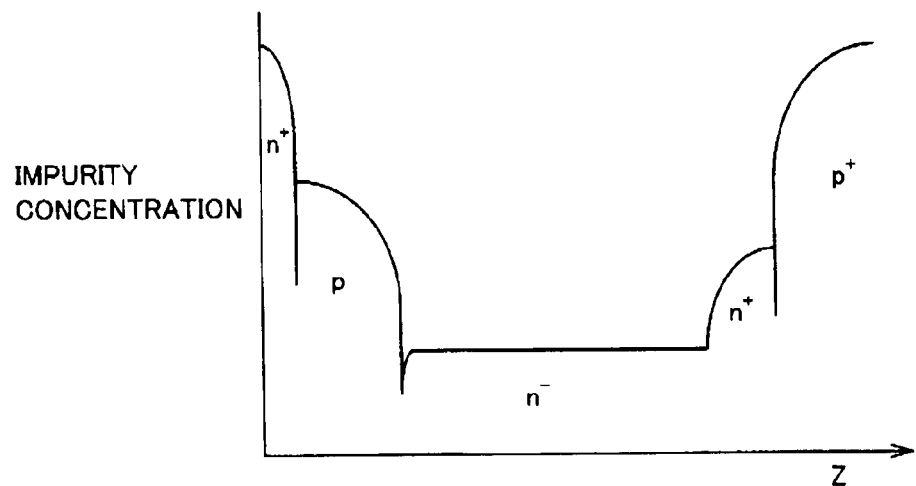
FIGS. 39 and 40 schematically show impurity concentration profiles taken along an arrow XXXIX in FIG. 37 and an arrow XL in FIG. 38, respectively.

Referring to FIGS. 37 and 39, peak concentrations in an impurity concentration profile along an arrow XXXIX (FIG. 37) are illustrated as the number of ions per unit volume. The peak concentration in n+ source regions 2 is $1\times10^{19}/cm^3$, the peak concentration in normal concentration base region 14n of p base layer 14V is $5\times10^{17}/cm^3$, the peak concentration in drift layer 8 is $1.5\times10^{14}/cm^3$, the peak concentration in n+ buffer layer 7 is $1\times10^{16}/cm^3$, and the peak concentration in p+ collector layer 6 is $1\times10^{19}/cm^3$.

Figure 38:
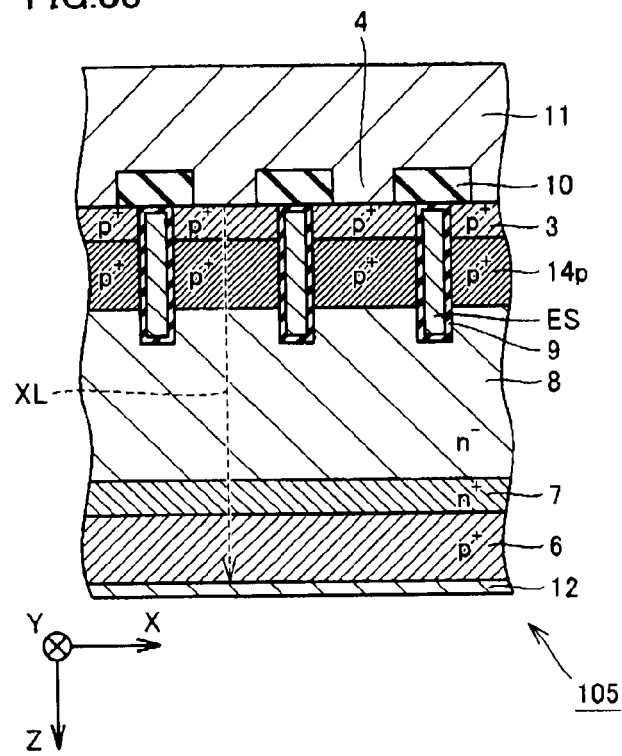
Figure 40:
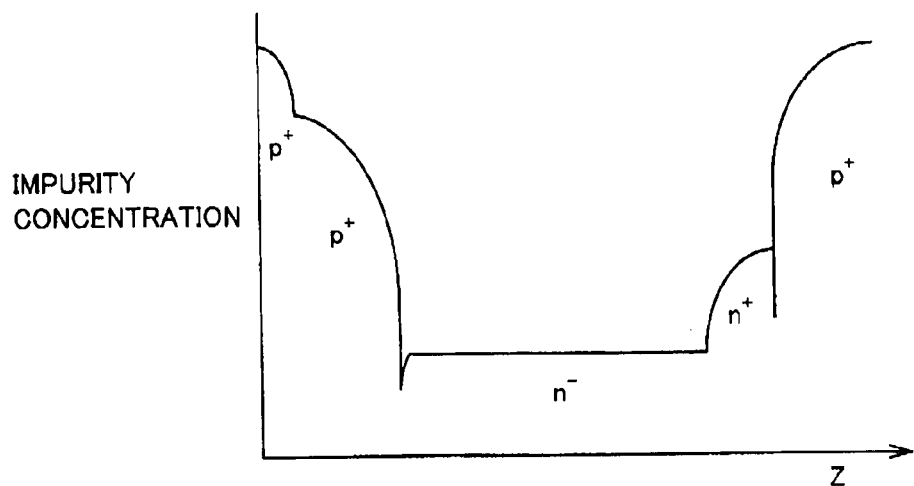

Referring to FIGS. 38 and 40, peak concentrations in an impurity concentration profile along an arrow XL (FIG. 38) are illustrated as the number of ions per unit volume. The peak concentration in p+ contact regions 3 is $1\times10^{19}/cm^3$, the peak concentration of high concentration base region 14p of p base layer 14V is $1\times10^{18}/cm^3$, the peak concentration in drift layer 8 is $1.5\times10^{14}/cm^3$, the peak concentration in n+ buffer layer 7 is $1\times10^{16}/cm^3$, and the peak concentration in p+ collector layer 6 is $1\times10^{19}/cm^3$.

Configurations other than those described above are substantially the same as those of the foregoing first embodiment. Hence, the same or corresponding elements are given the same reference characters and will not be described repeatedly.

Figure 41:
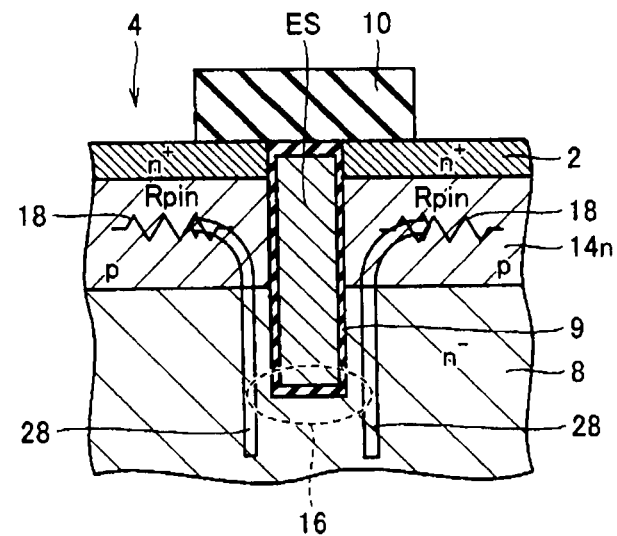
FIGS. 41 and 42 are respective enlarged partial views of FIGS. 37 and 38, showing behaviors of positive hole currents upon turning-off.
Figure 42:
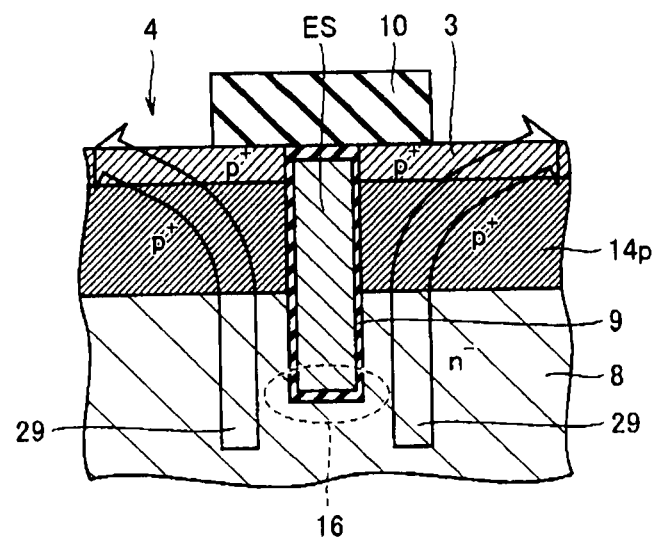

According to the present embodiment, in p base layer 14V, high concentration base regions 14p (FIG. 42) have low p base resistance, and positive hole currents are likely to flow toward the emitter side as indicated by arrows 29. As a result, upon turning-off, more positive hole currents flow in paths indicated by arrows 29 (FIG. 42) than those in paths indicated by arrows 28 (FIG. 41). This reduces current supplied to the bases of parasitic npn transistors 120 (FIG. 5), thereby preventing latch-up of IGBT 105.

In p base layer 14V, normal concentration base regions 14n (FIG. 41) can be adapted to have the same impurity concentration as that of p base layer 14 (FIG. 15) of IGBT 100 of the comparative example. Thus, IGBT 105 can be adapted to have the same electric characteristics (threshold voltage and the like) as those of IGBT 100 of the comparative example.

Although the present embodiment has dealt with an IGBT, the same effect as that in the present embodiment can be attained in a MOSFET by employing a structure obtained by removing p+ collector layer 6 from the structure of IGBT 105.

Sixth Embodiment

Figure 43:
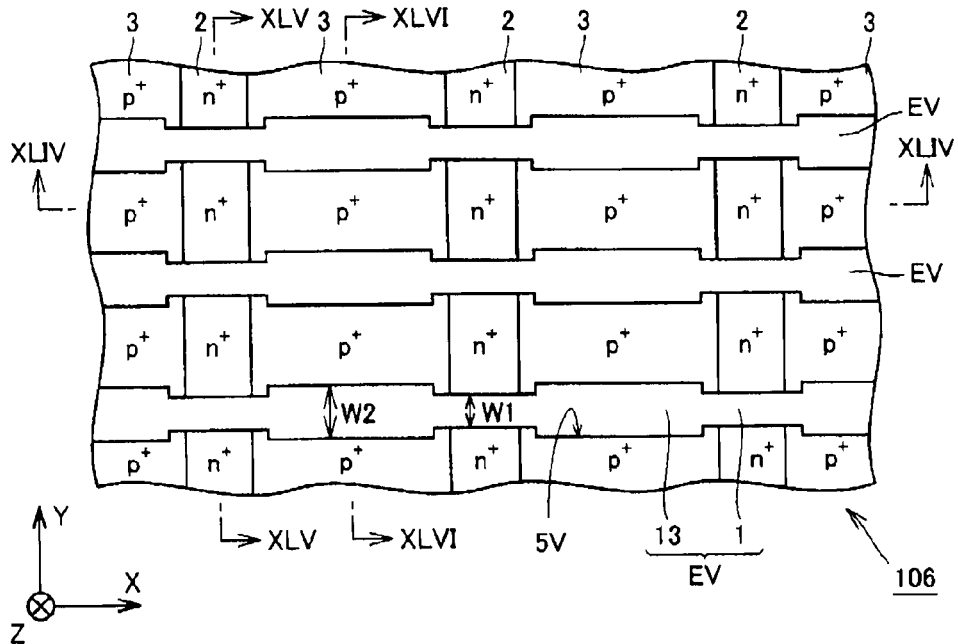
FIG. 43 is a partial plan view schematically showing a configuration of a power semiconductor device of a sixth embodiment of the present invention.
Figure 44:
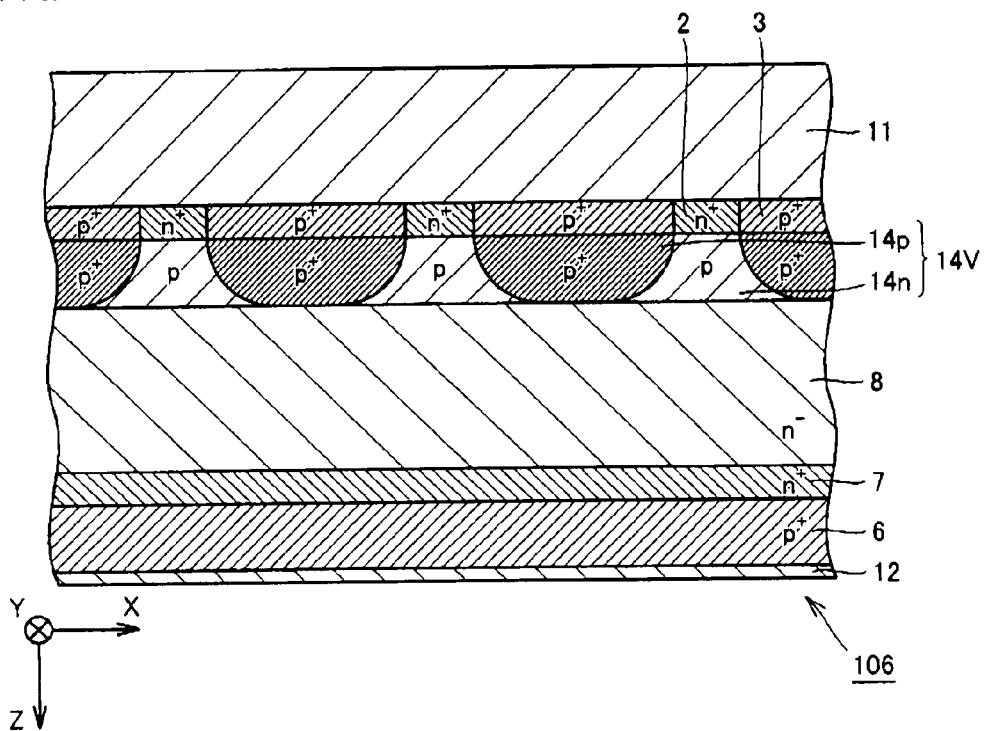
FIGS. 44-46 are schematic partial cross sectional views respectively taken along a line XLIV-XLIV, a line XLV-XLV, and a line XLVI-XLVI in FIG. 43.
Figure 45:
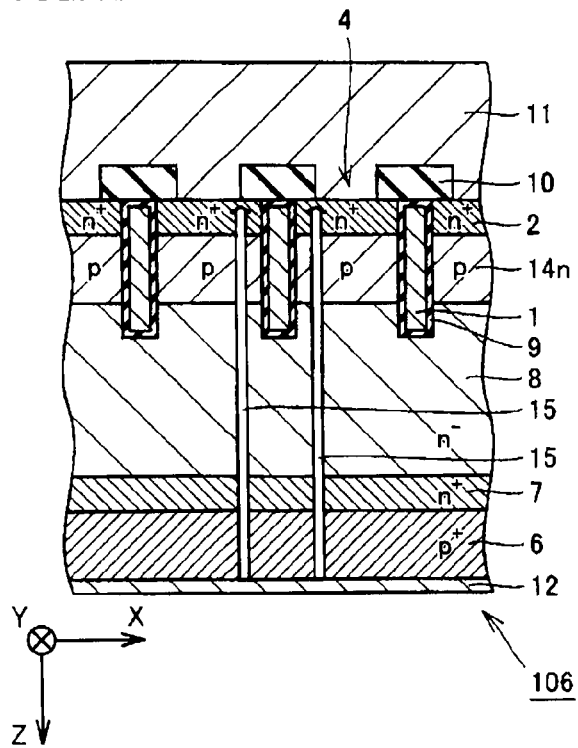
Figure 46:
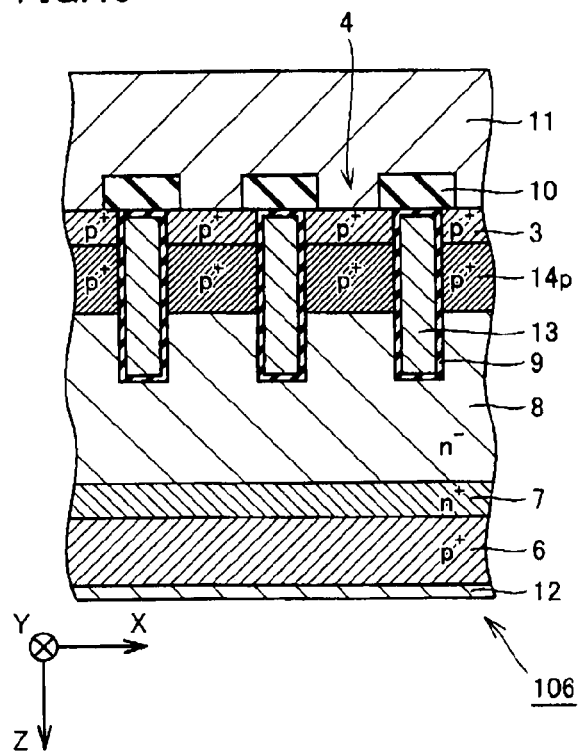

Referring to FIGS. 43-46, a configuration of an IGBT 106 will be described which serves as a power semiconductor device of the present embodiment. FIG. 43 shows a transistor cell of IGBT 106 when viewed from the emitter side. For visibility in FIG. 43, an emitter electrode 11, an interlayer insulating film 10, and a gate insulating film 9 are not shown therein.

IGBT 106 has a collector electrode 12 (first electrode), emitter electrode 11 (second electrode), gate insulating film 9, a gate electrode EV, interlayer insulating film 10, and a semiconductor layer. The semiconductor layer is provided on collector electrode 12, and has a p+ collector layer 6 (fourth layer) of p type (second conductive type), an n+ buffer layer 7 of n type (first conductive type), a drift layer 8 (first layer) of n type, a p base layer 14V (second layer) of p type (second conductive type), and a third layer. The third layer has n+ source regions 2 (first regions) of n type, and p+ contact regions 3 (second regions) of p type.

Gate electrode EV has first portions 1 (portions shown in FIG. 45) covered with normal concentration base regions 14n, with gate insulating film 9 interposed therebetween. Gate electrode EV has second portions 13 (portions shown in FIG. 46) covered with high concentration base regions 14p, with gate insulating film 9 interposed therebetween.

Configurations other than those described above are substantially the same as those of the foregoing first or fifth embodiment. Hence, the same or corresponding elements are given the same reference characters and will not be described repeatedly.

According to the present embodiment, in addition to the same function and effect as those of the fifth embodiment, the same function and effect as those of the first embodiment can be obtained. Thus, latch-up of IGBT 106 is restrained further.

Seventh Embodiment

Figure 47:
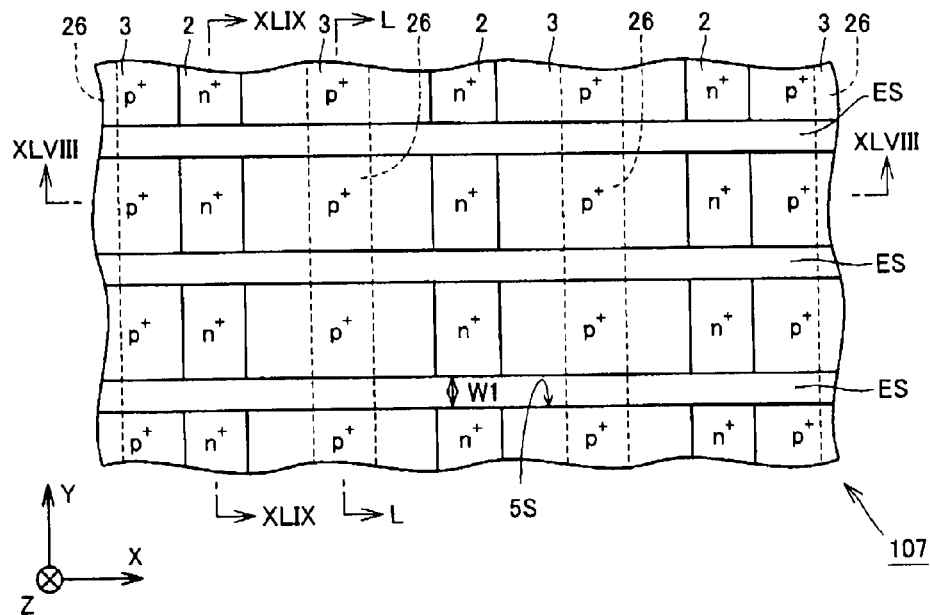
FIG. 47 is a partial plan view schematically showing a configuration of a power semiconductor device of a seventh embodiment of the present invention.
Figure 48:
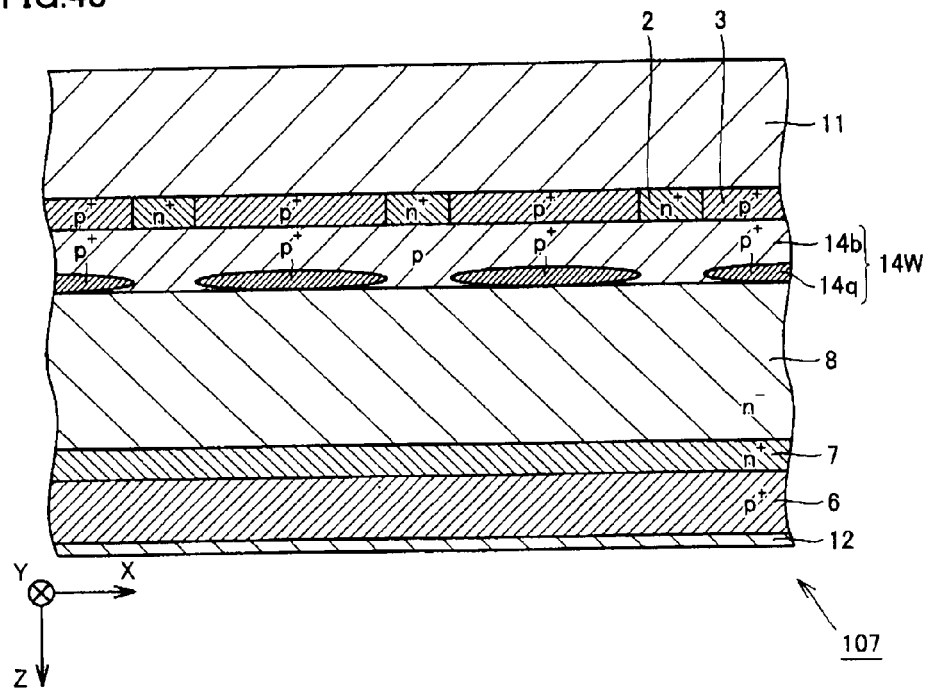
FIGS. 48-50 are schematic partial cross sectional views respectively taken along a line XLVIII-XLVIII, a line XLIX-XLIX, and a line L-L in FIG. 47.

Referring to FIGS. 47-50, a configuration of an IGBT 107 will be described which serves as a power semiconductor device of the present embodiment. FIG. 47 shows a transistor cell of IGBT 107 when viewed from the emitter side. For visibility in FIG. 47, an emitter electrode 11, an interlayer insulating film 10, and a gate insulating film 9 are not shown therein.

IGBT 107 has a collector electrode 12 (first electrode), emitter electrode 11 (second electrode), gate insulating film 9, a gate electrode ES, interlayer insulating film 10, and a semiconductor layer. The semiconductor layer is provided on collector electrode 12, and has a p+ collector layer 6 (fourth layer) of p type (second conductive type), an n+ buffer layer 7 of n type (first conductive type), drift layer 8 (first layer) of n type, a p base layer 14W (second layer) of p type (second conductive type), and a third layer. The third layer has n⁺ source regions 2 (first regions) of n type, and p⁺ contact regions 3 (second region) of p type.

P base layer 14W is provided on drift layer 8, and has base regions 14b and retrograde regions 14q. Retrograde regions 14q are provided in regions corresponding to the locations of p⁺ contact regions 3, when viewed in a planar view (FIG. 47). Further, retrograde regions 14q are formed in base regions 14b via the emitter electrode 11 side (upper side in FIG. 48) of the semiconductor layer to have a retrograde structure. The retrograde structure will be described below in detail.

Retrograde regions 14q can be formed by, for example, injecting boron with a high energy of MeV level, using a mask pattern having openings 26 (FIG. 47).

Gate electrode ES has first portions (portions shown in FIG. 49) each projecting into drift layer 8 through n⁺ source regions 2 and base regions 14b of p base layer 14W, and second portions (portions shown in FIG. 50) each projecting into drift layer 8 through p⁺ contact regions 3 and p base layer 14W. The first and second portions are formed in one piece. Namely, when viewed in a planar view, gate electrode ES is provided to transverse the striped arrangement of n⁺ source regions 2 and p⁺ contact regions 3. In this way, n⁺ source regions 2 and p⁺ contact regions 3 are configured to have the same potential.

Figure 49:
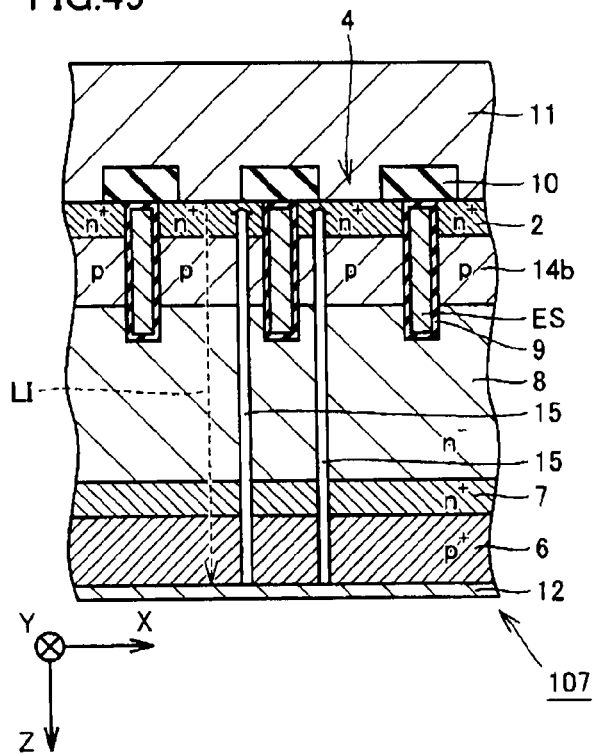
Figure 51:
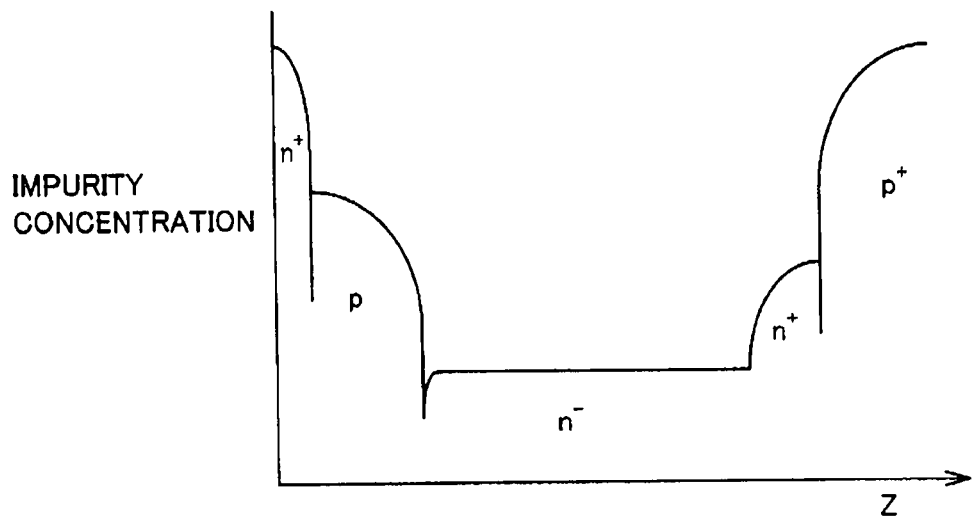
FIGS. 51 and 52 schematically show impurity concentration profiles respectively taken along an arrow LI in FIG. 49 and an arrow LII in FIG. 50.

Referring to FIGS. 49 and 51, peak concentrations in an impurity concentration profile along an arrow LI (FIG. 49) are illustrated as the number of ions per unit volume. The peak concentration in n⁺ source regions 2 is $1 \times 10^{19}/\text{cm}^3$, the peak concentration in base regions 14b of p base layer 14W is $5 \times 10^{17}/\text{cm}^3$, the peak concentration in drift layer 8 is $1.5 \times 10^{14}/\text{cm}^3$, the peak concentration in n⁺ buffer layer 7 is $1 \times 10^{16}/\text{cm}^3$, and the peak concentration in p⁺ collector layer 6 is $1 \times 10^{19}/\text{cm}^3$.

Figure 50:
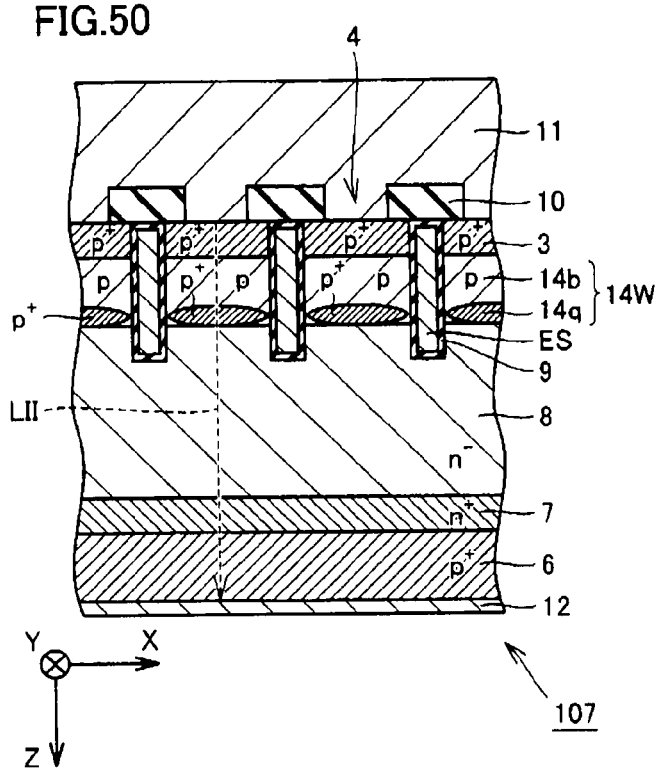
Figure 52:
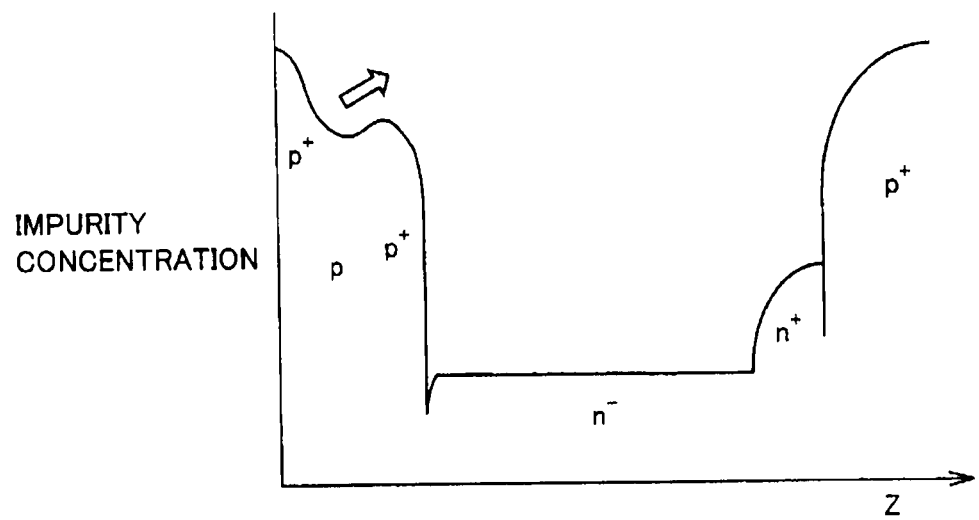

Referring to FIGS. 50 and 52, peak concentrations in an impurity concentration profile along an arrow LII (FIG. 50) are illustrated as the number of ions per unit volume. The peak concentration in p⁺ contact regions 3 is $1 \times 10^{19}/\text{cm}^3$, the peak concentration in base regions 14b of p base layer 14 is $5 \times 10^{17}/\text{cm}^3$, the peak concentration in retrograde regions 14q of p base layer 14W is $1 \times 10^{18}/\text{cm}^3$, the peak concentration in drift layer 8 is $1.5 \times 10^{14}/\text{cm}^3$, the peak concentration in n⁺ buffer layer 7 is $1 \times 10^{16}/\text{cm}^3$, and the peak concentration in p⁺ collector layer 6 is $1 \times 10^{19}/\text{cm}^3$. As indicated by an arrow in FIG. 52, p base layer 14W has such an impurity concentration profile that an impurity concentration is increased as Z, the depth, is increased. Namely, p base layer 14W has a retrograde profile. In other words, p base layer 14W has a retrograde structure.

Configurations other than those described above are substantially the same as those of the foregoing first embodiment. Hence, the same or corresponding elements are given the same reference characters and will not be described repeatedly.

According to the present embodiment, since retrograde regions 14q are provided in the regions just below p⁺ contact regions 3 in FIG. 50, an effect of preventing latch-up can be obtained as with the fifth embodiment (FIG. 38). Further, the retrograde structure can particularly decrease the p base resistance of p base layer 14W at its portion located in the vicinity of n⁻ drift layer 8. This effect can be increased more.

Although the present embodiment has dealt with an IGBT, the same effect as that in the present embodiment can be attained in a MOSFET by employing a structure obtained by removing p⁺ collector layer 6 from the structure of IGBT 107.

Eighth Embodiment

Figure 53:
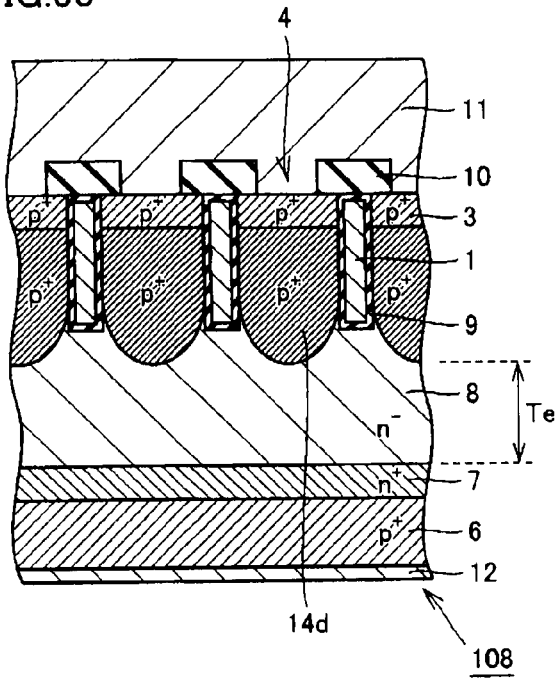
FIG. 53 is a partial cross sectional view schematically showing a configuration of a power semiconductor device of an eighth embodiment of the present invention.

Referring to mainly FIG. 53, an IGBT 108 serving as a power semiconductor device of the present embodiment has high concentration base regions 14d instead of high concentration base regions 14p (FIG. 38) of the fifth embodiment. High concentration base regions 14d are different from high concentration base regions 14p in that they are formed deeper than gate electrode ES.

The flat surface pattern of high concentration base regions 14d is the same as that of high concentration base regions 14p.

Configurations other than those described above are substantially the same as those of the foregoing fifth embodiment. Hence, the same or corresponding elements are given the same reference characters and will not be described repeatedly.

According to the present embodiment, latch-up can be prevented as with the fifth embodiment. However, effective thickness Te (FIG. 53) of n− drift layer 8 is thin and main breakdown voltage is accordingly decreased. To prevent such decrease of the main breakdown voltage, high concentration base regions 14p each formed shallower than gate electrode ES are preferably employed as shown in FIG. 38.

Ninth Embodiment

Figure 54:
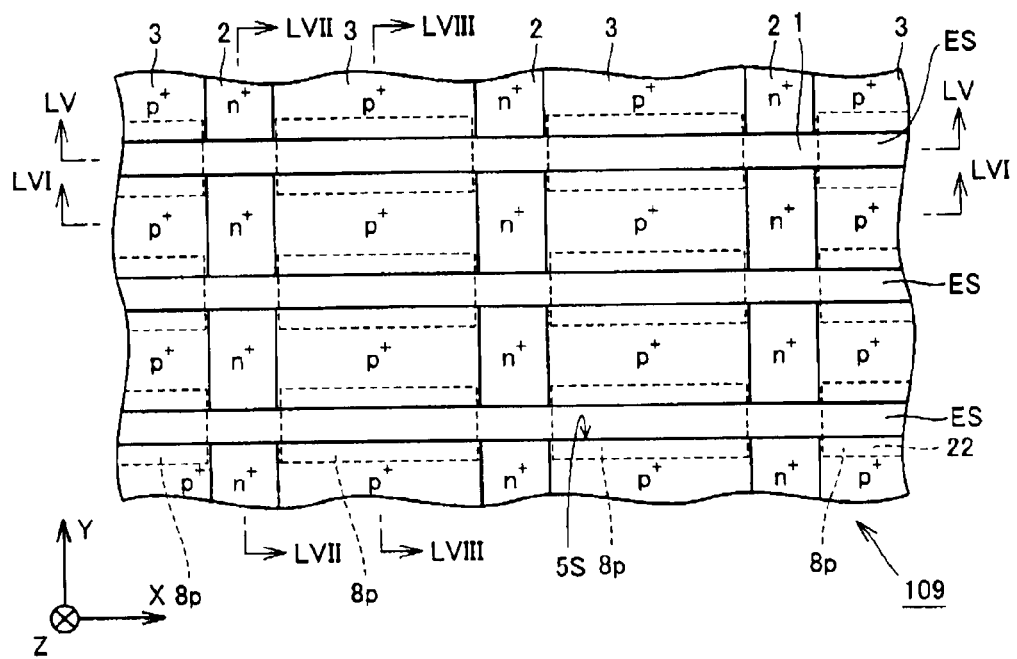
FIG. 54 is a partial plan view schematically showing a configuration of a power semiconductor device of a ninth embodiment of the present invention.
Figure 55:
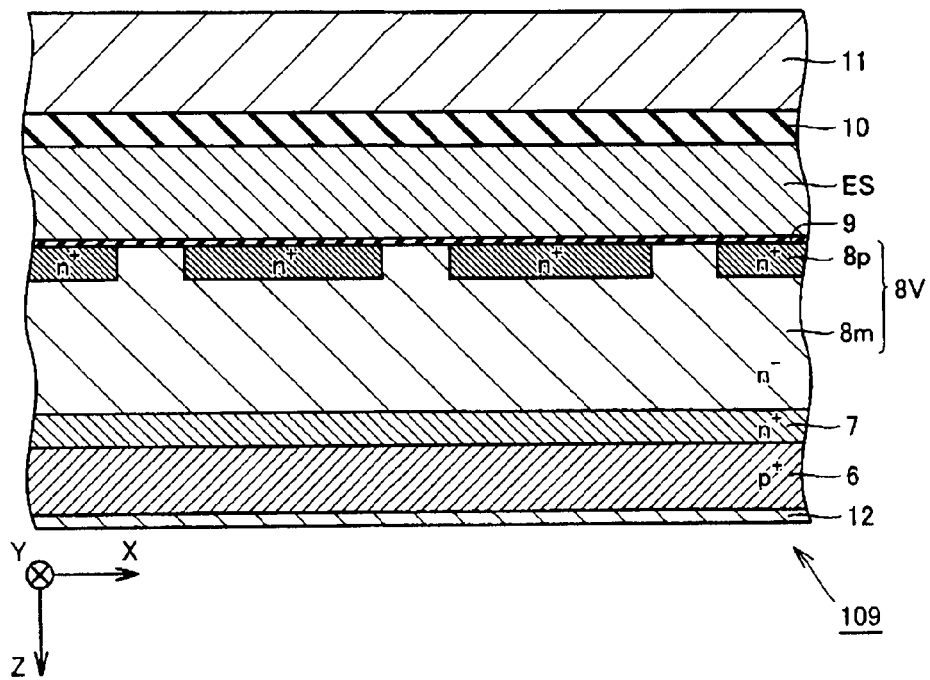
FIGS. 55-58 are schematic partial cross sectional views respectively taken along a line LV-LV, a line LVI-LVI, a line LVII-LVII, and a line LVIII-LVIII in FIG. 54.
Figure 56:
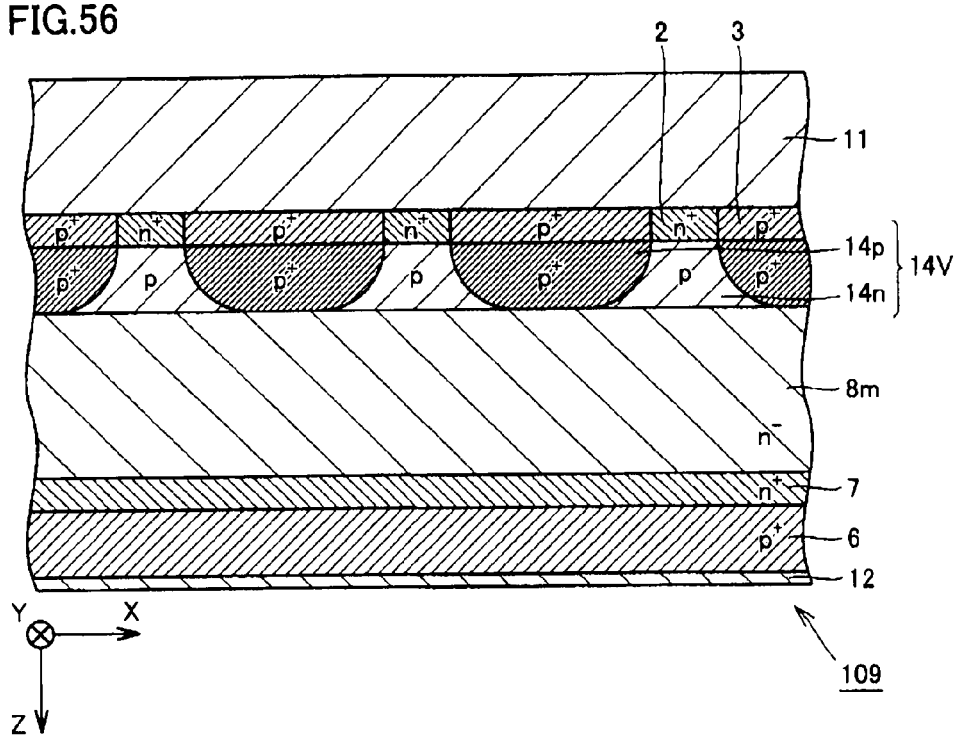

Referring to FIGS. 54-58, a configuration of an IGBT 109 will be described which serves as a power semiconductor device of the present embodiment. FIG. 54 shows a transistor cell of IGBT 109 when viewed from the emitter side. For visibility in FIG. 54, an emitter electrode 11, an interlayer insulating film 10, and a gate insulating film 9 are not shown therein.

IGBT 109 has a collector electrode 12 (first electrode), emitter electrode 11 (second electrode), gate insulating film 9, a gate electrode ES, interlayer insulating film 10, and a semiconductor layer. The semiconductor layer is provided on collector electrode 12, and has a p⁺ collector layer 6 (fourth layer) of p type (second conductive type), an n⁺ buffer layer 7 of n type (first conductive type), a drift layer 8V (first layer) of n type, a p base layer 14V (second layer) of p type (second conductive type), and a third layer. The third layer has n⁺ source regions 2 (first regions) of n type, and p⁺ contact regions 3 (second regions) of p type. Drift layer 8V has substantially the same configuration as that in the second embodiment, and p base layer 14V has substantially the same configuration as that in the fifth embodiment.

Figure 57:
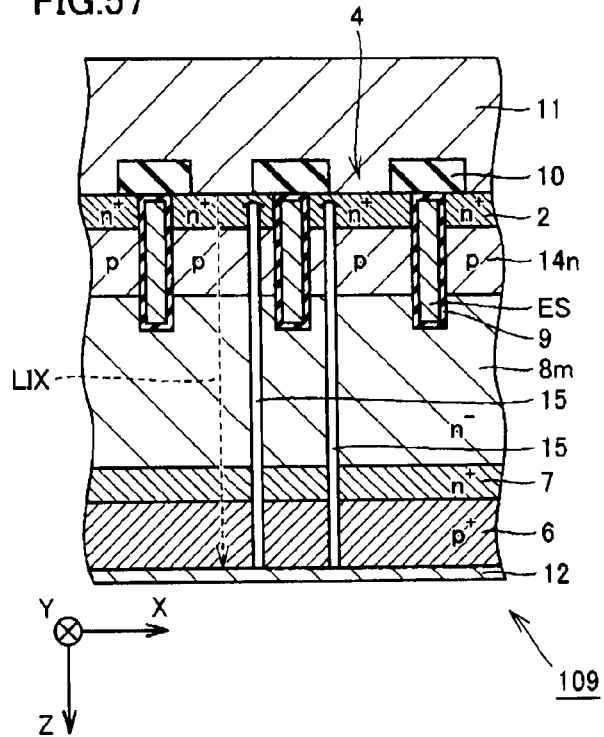
Figure 59:
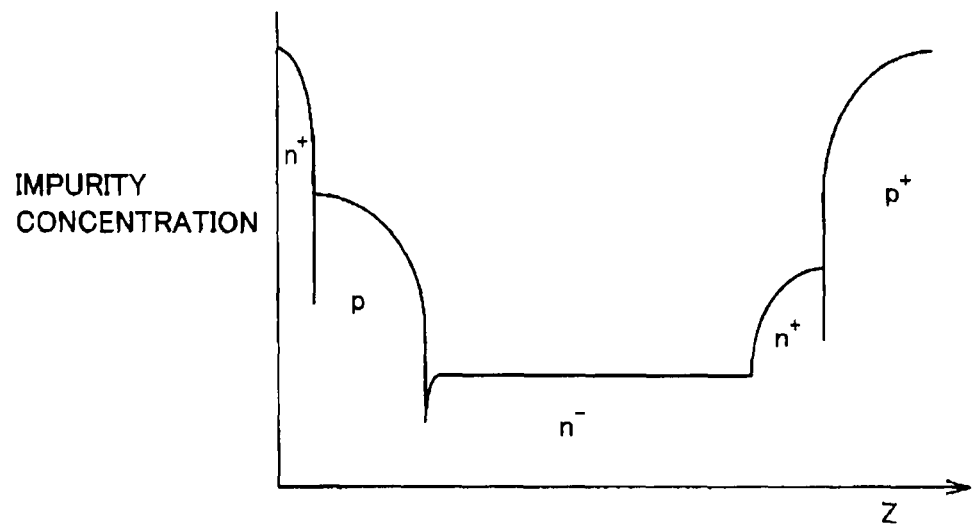
FIGS. 59 and 60 schematically show impurity concentration profiles along an arrow LIX in FIG. 57 and an arrow LX in FIG. 58, respectively.

Referring to FIGS. 57 and 59, peak concentrations in an impurity concentration profile along an arrow LIX (FIG. 57) are illustrated as the number of ions per unit volume. The peak concentration in n⁺ source regions 2 is $1 \times 10^{19}/\text{cm}^3$, the peak concentration in normal concentration base regions 14n of p base layer 14V is $5 \times 10^{17}/\text{cm}^3$, the peak concentration in low concentration region 8m of drift layer 8V is $1.5 \times 10^{14}/\text{cm}^3$, the peak concentration in n⁺ buffer layer 7 is $1 \times 10^{16}/\text{cm}^3$, and the peak concentration in p⁺ collector layer 6 is $1 \times 10^{19}/\text{cm}^3$.

Figure 58:
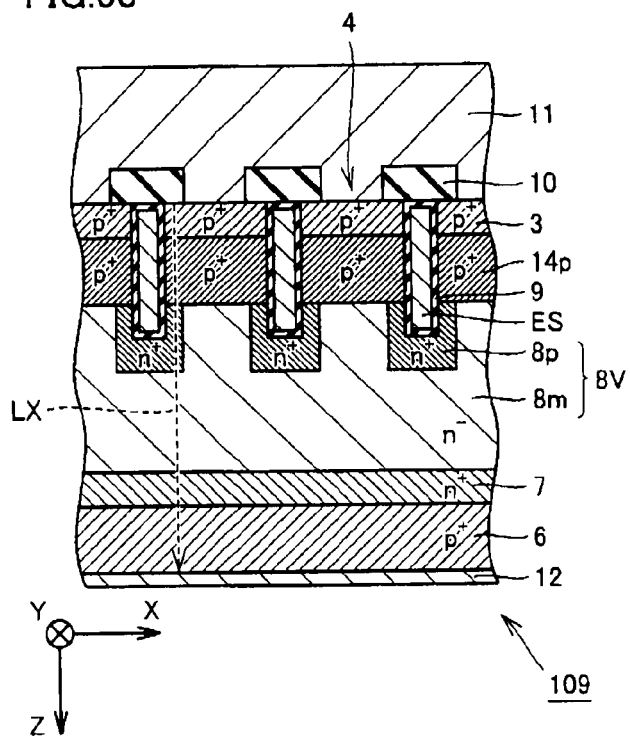
Figure 60:
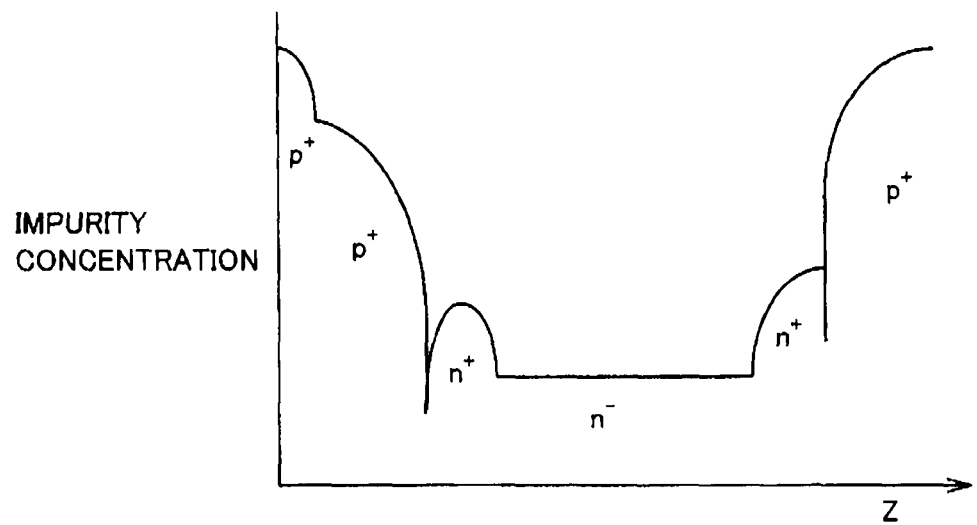

Referring to FIGS. 58 and 60, peak concentrations in an impurity concentration profile along an arrow LX (FIG. 58) are illustrated as the number of ions per unit volume. The peak concentration in p⁺ contact regions 3 is $1 \times 10^{19}/\text{cm}^3$, the peak concentration in high concentration base regions 14p of p base layer 14V is $1 \times 10^{18}/\text{cm}^3$, the peak concentration in high concentration regions 8p of drift layer 8V is $1 \times 10^{15}/\text{cm}^3$, the peak concentration in low concentration regions 8m of drift layer 8V is $1.5 \times 10^{14}/cm^3$, the peak concentration in n$^+$ buffer layer 7 is $1 \times 10^{16}/cm^3$, and the peak concentration in p$^+$ collector layer 6 is $1 \times 10^{19}/cm^3$.

Configurations other than those described above are substantially the same as those of the foregoing second or fifth embodiment. Hence, the same or corresponding elements are given the same reference characters and will not be described repeatedly.

According to the present embodiment, an effect of preventing latch-up can be obtained as with the second embodiment. Further, the same effect as that of the fifth embodiment can also be obtained, thus preventing latch-up more securely.

Tenth Embodiment

Figure 61:
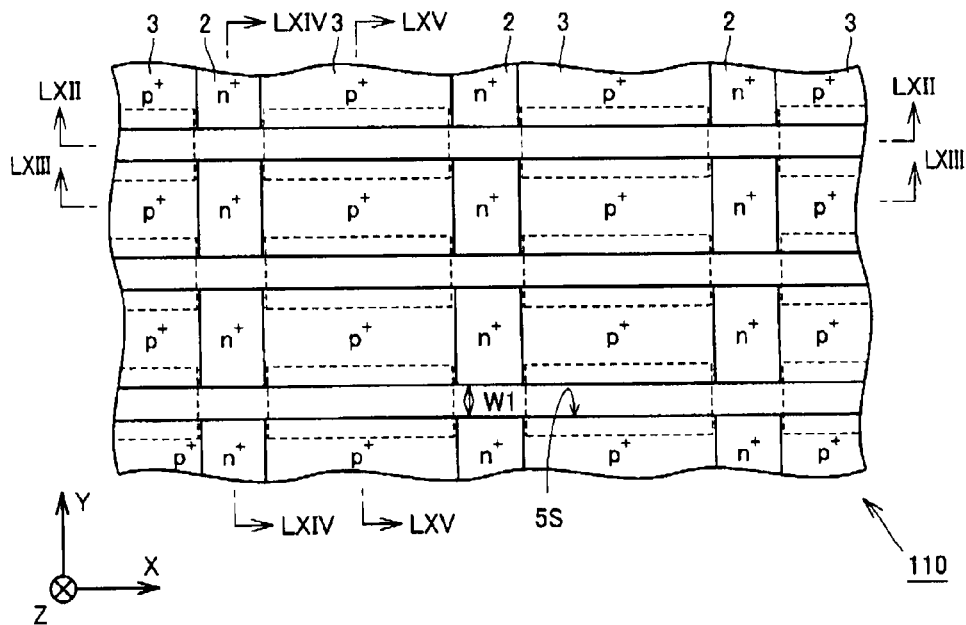
FIG. 61 is a partial plan view schematically showing a configuration of a power semiconductor device of a tenth embodiment of the present invention.
Figure 62:
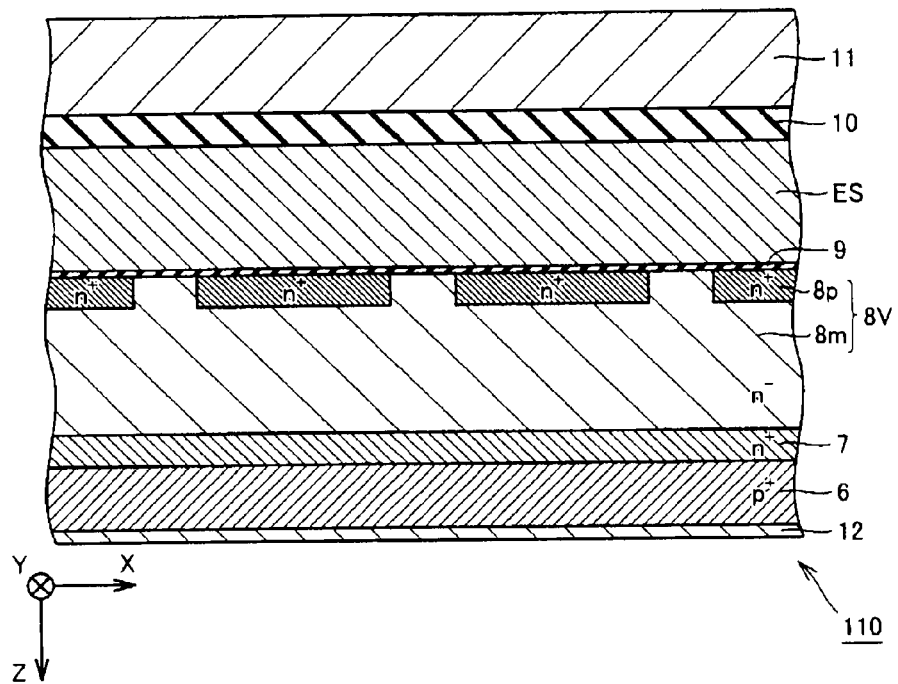
FIGS. 62-65 are schematic partial cross sectional views respectively taken along a line LXII-LXII, a line LXIII-LXIII, a line LXIV-LXIV, and a line LXV-LXV in FIG. 61.
Figure 63:
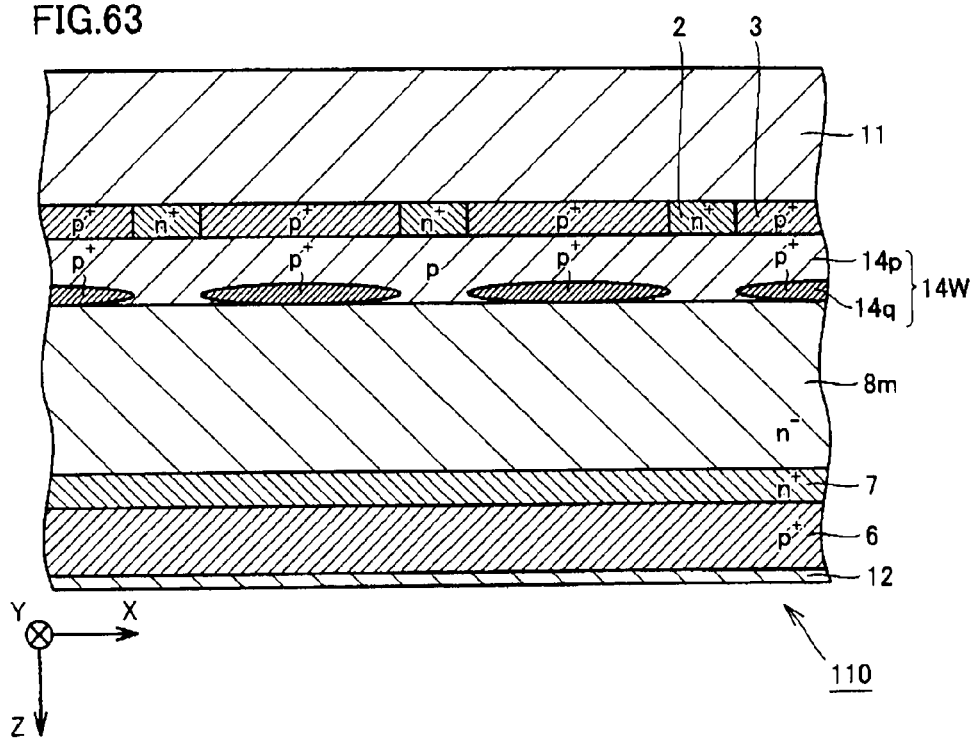

Referring to FIGS. 61-65, a configuration of an IGBT 110 will be described which serves as a power semiconductor device of the present embodiment. FIG. 61 shows a transistor cell of IGBT 110 when viewed from the emitter side. For visibility in FIG. 61, an emitter electrode 11, an interlayer insulating film 10, and a gate insulating film 9 are not shown therein.

IGBT 110 has a collector electrode 12 (first electrode), emitter electrode 11 (second electrode), gate insulating film 9, a gate electrode ES, interlayer insulating film 10, and a semiconductor layer. The semiconductor layer is provided on collector electrode 12, and has a p$^+$ collector layer 6 (fourth layer) of p type (second conductive type), an n$^+$ buffer layer 7 of n type (first conductive type), a drift layer 8V (first layer) of n type, a p base layer 14W (second layer) of p type (second conductive type), and a third layer. The third layer has n$^+$ source regions 2 (first regions) of n type, and p$^+$ contact regions 3 (second regions) of p type. Drift layer 8V has substantially the same configuration as that in the second embodiment, and p base layer 14W has substantially the same configuration as that in the seventh embodiment.

Figure 64:
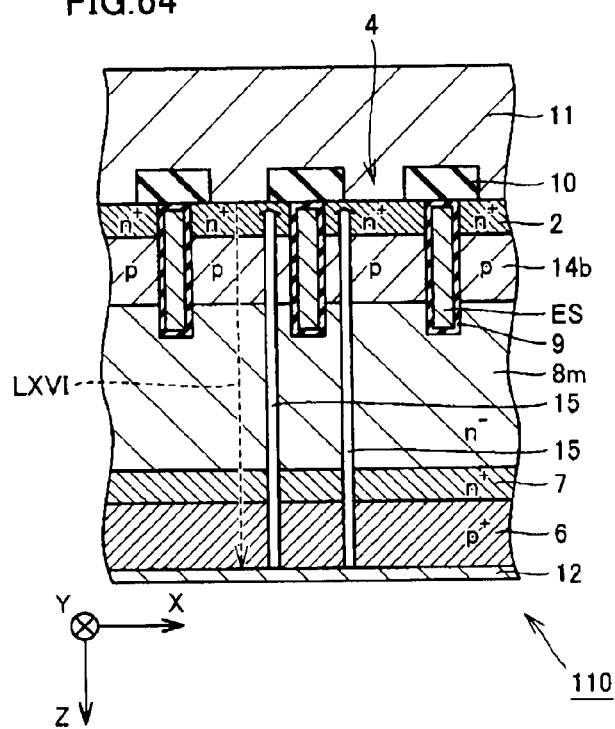
Figure 66:
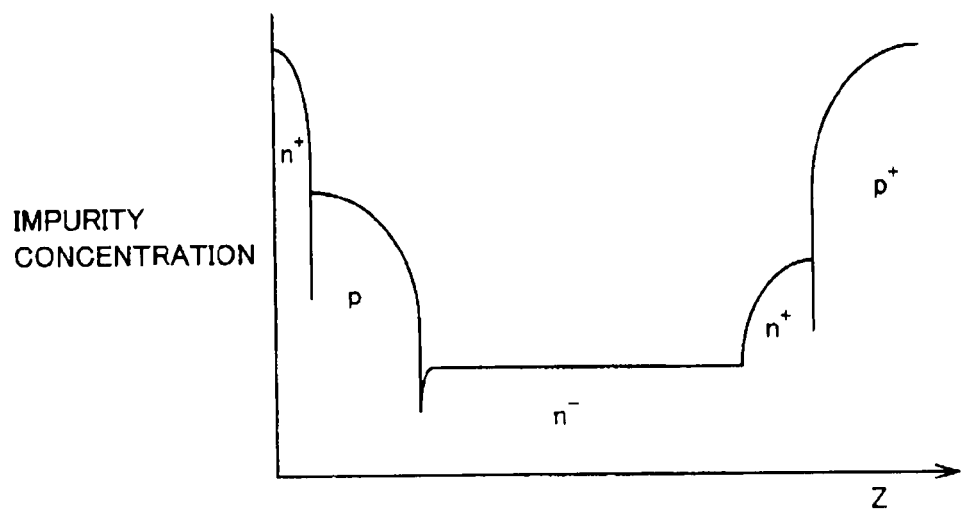
FIGS. 66 and 67 show impurity concentration profiles respectively taken along an arrow LXVI in FIG. 64 and an arrow LXVII in FIG. 65.

Referring to FIGS. 64 and 66, peak concentrations in an impurity concentration profile along an arrow LXVI (FIG. 64) are illustrated as the number of ions per unit volume. The peak concentration in n$^+$ source regions 2 is $1 \times 10^{19}/cm^3$, the peak concentration in base regions 14b of p base layer 14W is $5 \times 10^{17}/cm^3$, the peak concentration in low concentration region 8m of drift layer 8V is $1.5 \times 10^{14}/cm^3$, the peak concentration in n$^+$ buffer layer 7 is $1 \times 10^{16}/cm^3$, and the peak concentration in p$^+$ collector layer 6 is $1 \times 10^{19}/cm^3$.

Figure 65:
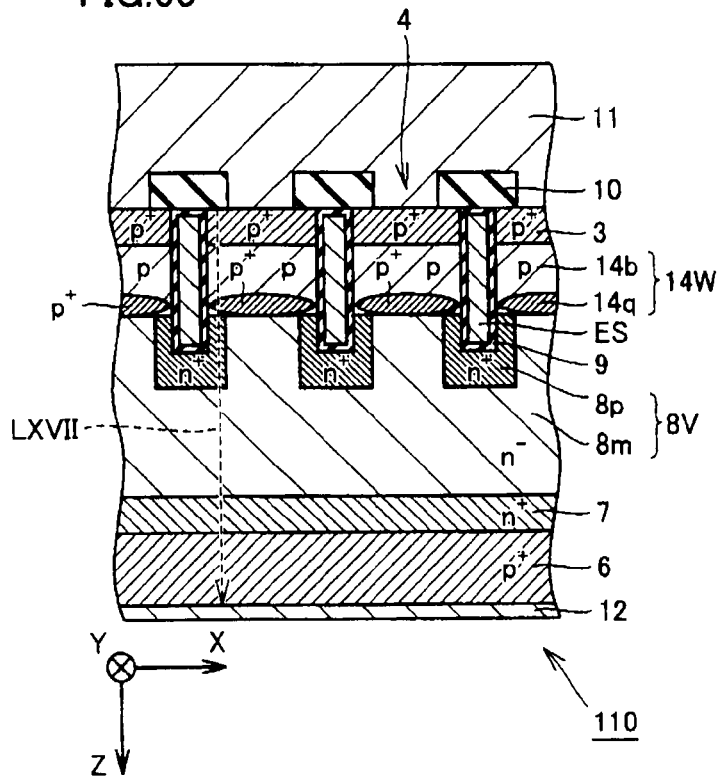
Figure 67:
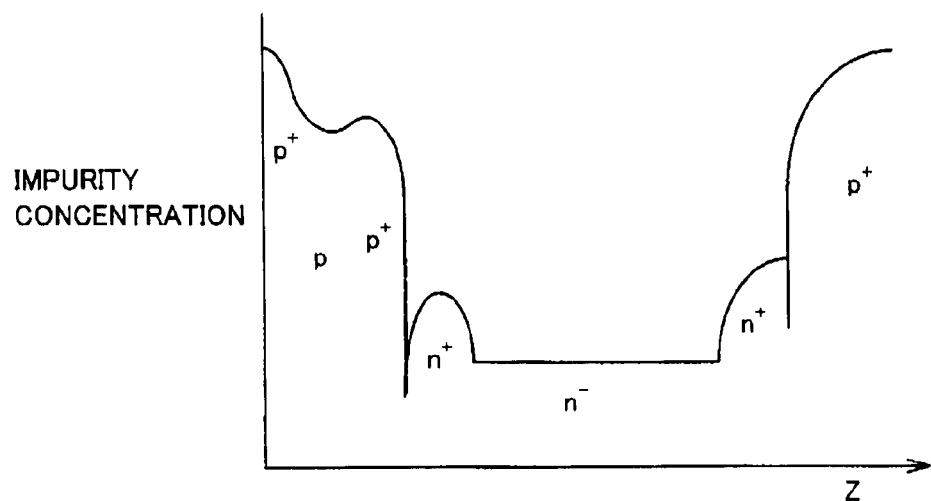

Referring to FIGS. 65 and 67, peak concentrations in an impurity concentration profile along an arrow LXVII (FIG. 65) are illustrated as the number of ions per unit volume. The peak concentration in p$^+$ contact regions 3 is $1 \times 10^{19}/cm^3$, the peak concentration in base regions 14b of p base layer 14W is $5 \times 10^{17}/cm^3$, the peak concentration in retrograde regions 14q of p base layer 14W is $1 \times 10^{18}/cm^3$, the peak concentration in high concentration region 8p of drift layer 8V is $1 \times 10^{15}/cm^3$, the peak concentration in low concentration region 8m of drift layer 8V is $1.5 \times 10^{14}/cm^3$, the peak concentration in n' buffer layer 7 is $1 \times 10^{16}/cm^3$, and the peak concentration in p$^+$ collector layer 6 is $1 \times 10^{19}/cm^3$.

Configurations other than those described above are substantially the same as those of the foregoing second or seventh embodiment. Hence, the same or corresponding elements are given the same reference characters and will not be described repeatedly.

According to the present embodiment, an effect of preventing latch-up can be obtained as with the second embodiment.

Further, the same effect as that of the seventh embodiment can be obtained, thus preventing latch-up more securely.

Eleventh Embodiment

Figure 68:
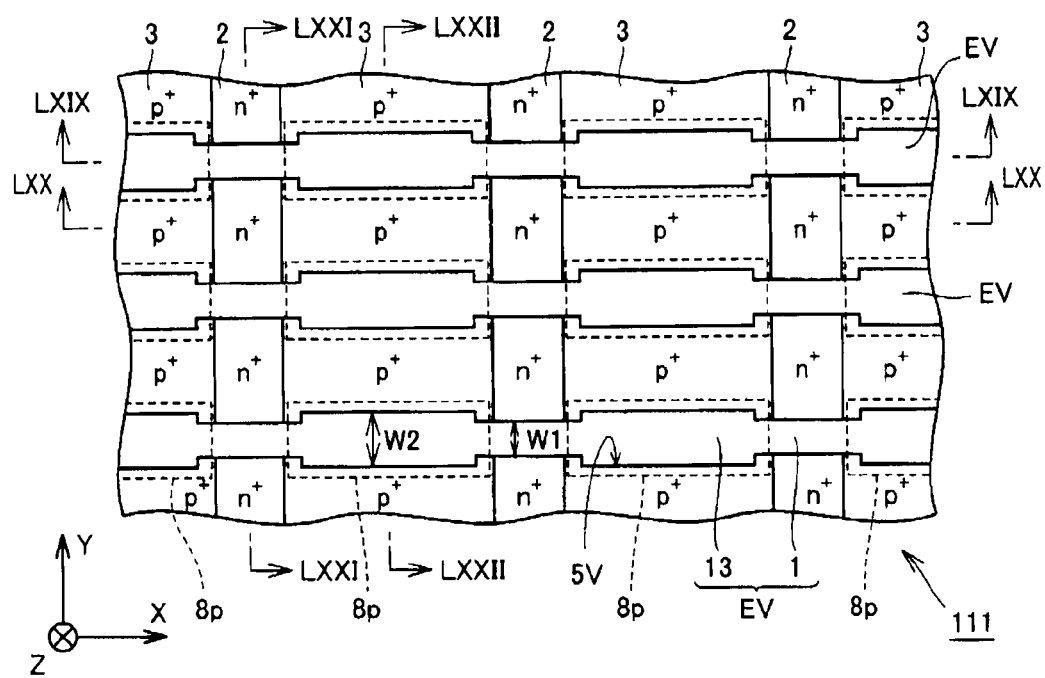
FIG. 68 is a partial plan view schematically showing a configuration of a power semiconductor device of an eleventh embodiment of the present invention.
Figure 69:
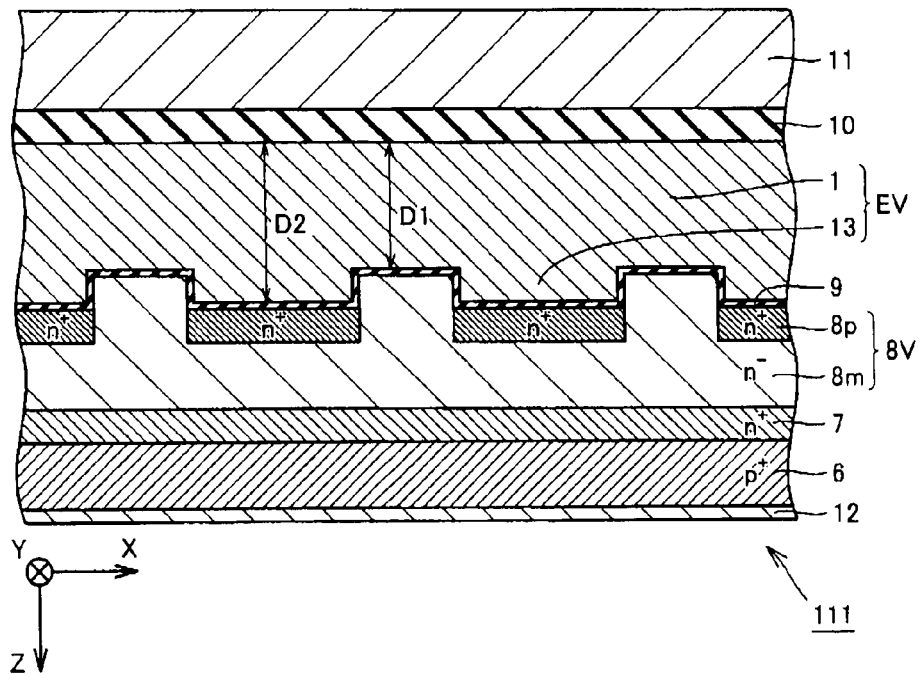
FIGS. 69-72 are schematic partial cross sectional views respectively taken along a line LXIX-LXIX, a line LXX-LXX, a line LXXI-LXXI, and a line LXXII-LXXII in FIG. 68.
Figure 70:
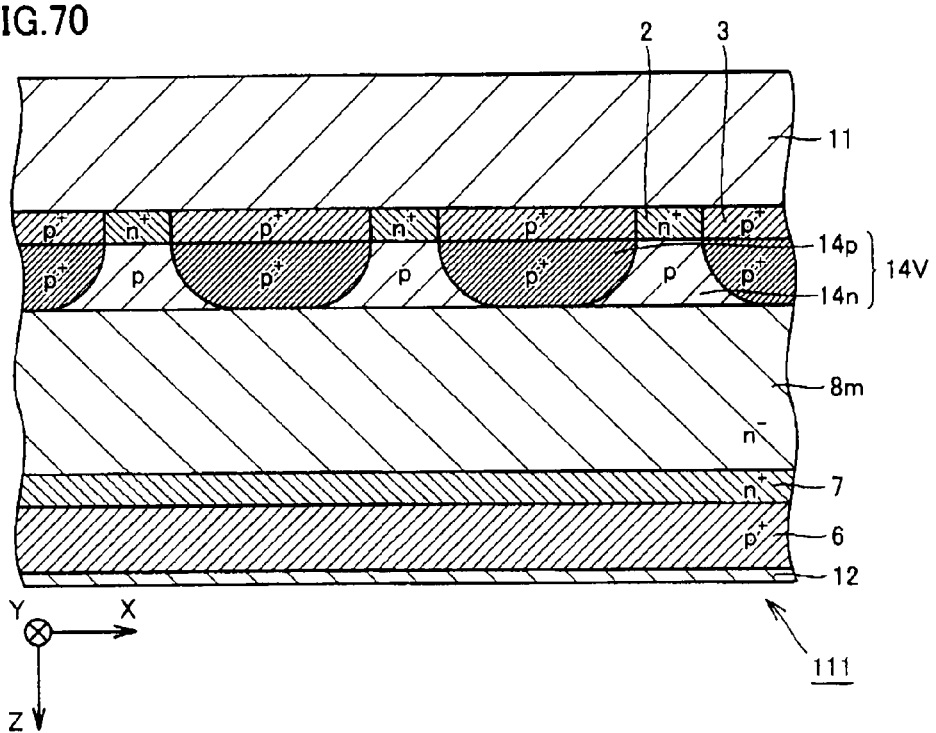

Referring to FIGS. 68-72, a configuration of an IGBT 111 will be described which serves as a power semiconductor device of the present embodiment. FIG. 68 shows a transistor cell of IGBT 111 when viewed from the emitter side. For visibility in FIG. 68, an emitter electrode 11, an interlayer insulating film 10, and a gate insulating film 9 are not shown therein.

IGBT 111 has a collector electrode 12 (first electrode), emitter electrode 11 (second electrode), gate insulating film 9, a gate electrode EV, interlayer insulating film 10, and a semiconductor layer. The semiconductor layer is provided on collector electrode 12, has a p$^+$ collector layer 6 (fourth layer) of p type (second conductive type), an n$^+$ buffer layer 7 of n type (first conductive type), a drift layer 8V (first layer) of n type, a p base layer 14V (second layer) of p type (second conductive type), and a third layer. The third layer has n$^+$ source regions 2 (first regions) of n type, and p$^+$ contact region 3 (second region) of p type.

Respective configurations of gate electrode EV, drift layer 8V, and p base layer 14V are substantially the same as those in the first, second, and fifth embodiments.

Figure 71:
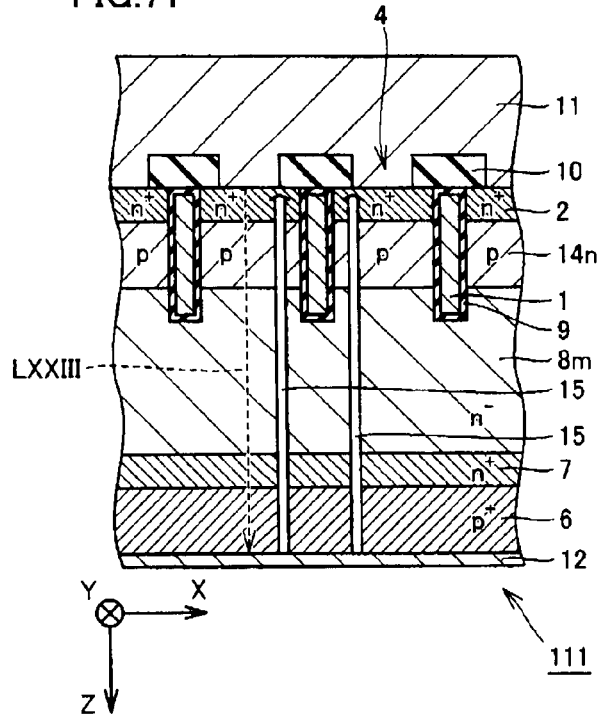
Figure 73:
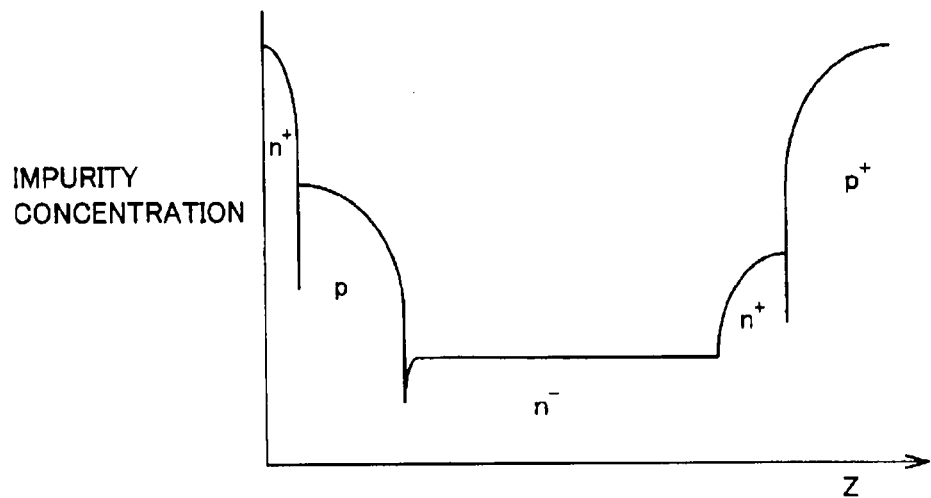
FIGS. 73 and 74 schematically show impurity concentration profiles taken along an arrow LXXIII in FIG. 71 and an arrow LXXIV in FIG. 72, respectively.

Referring to FIGS. 71 and 73, peak concentrations in an impurity concentration profile along an arrow LXXIII (FIG. 71) are illustrated as the number of ions per unit volume. The peak concentration in n$^+$ source regions 2 is $1 \times 10^{19}/cm^3$, the peak concentration in normal concentration base regions 14n of p base layer 14V is $5 \times 10^{17}/cm^3$, the peak concentration in low concentration region 8m of drift layer 8V is $1.5 \times 10^{14}/cm^3$, the peak concentration in n$^+$ buffer layer 7 is $1 \times 10^{16}/cm^3$, and the peak concentration in p$^+$ collector layer 6 is $1 \times 10^{19}/cm^3$.

Figure 72:
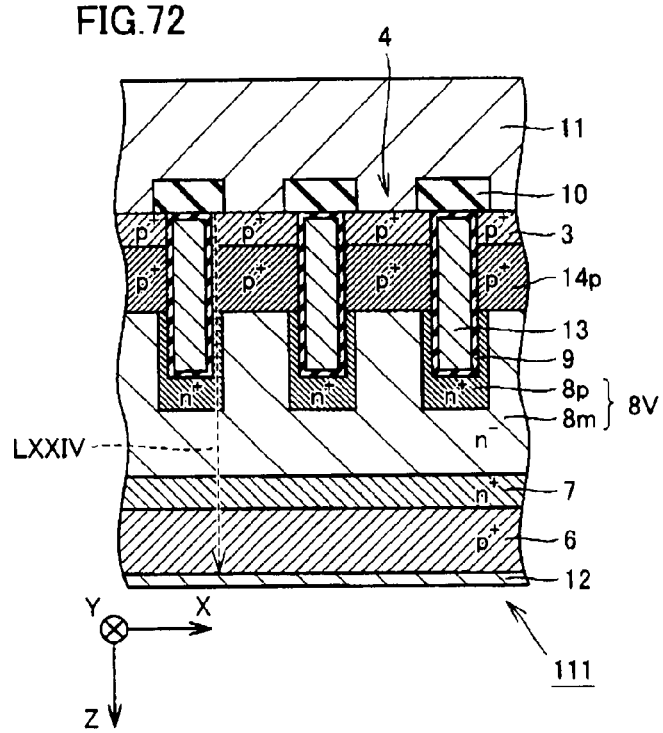
Figure 74:
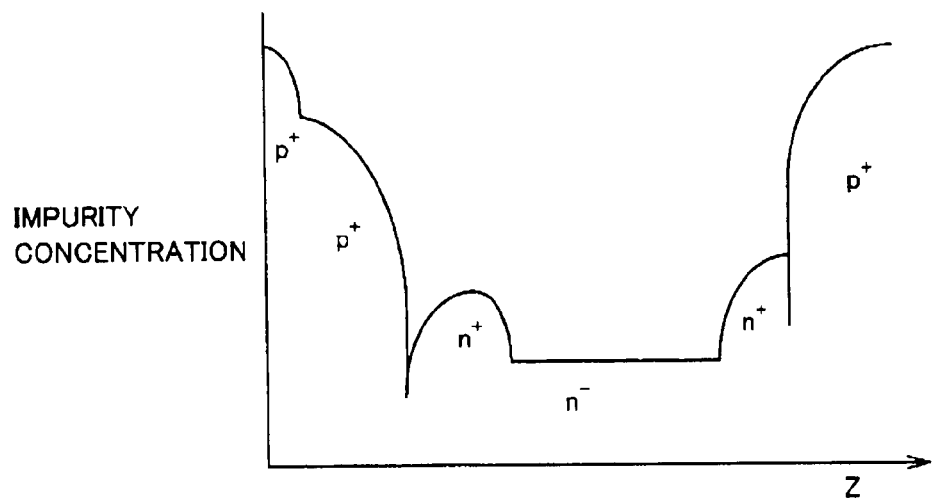

Referring to FIGS. 72 and 74, peak concentrations in an impurity concentration profile along an arrow LXXIV (FIG. 72) are illustrated as the number of ions per unit volume. The peak concentration in p$^+$ contact regions 3 is $1 \times 10^{19}/cm^3$, the peak concentration in high concentration base regions 14p of p base layer 14V is $1 \times 10^{18}/cm^3$, the peak concentration in high concentration regions 8p of drift layer 8V is $1 \times 10^{15}/cm^3$, the peak concentration in low concentration region 8m of drift layer 8V is $1.5 \times 10^{14}/cm^3$, the peak concentration in n$^+$ buffer layer 7 is $1 \times 10^{16}/cm^3$, and the peak concentration in p$^+$ collector layer 6 is $1 \times 10^{19}/cm^3$.

Configurations other than those described above are substantially the same as those of the foregoing first, second, or fifth embodiment. Hence, the same or corresponding elements are given the same reference characters and will not be described repeatedly.

According to the present embodiment, an effect of preventing latch-up can be obtained as with the fifth embodiment. Further, the same effect as those in the first and second embodiments can be obtained, thus preventing latch-up more securely.

It should be noted that in the description of each of the above-described embodiments, the first conductive type corresponds to n type and the second conductive type corresponds to p type, but the first conductive type may correspond to p type and the second conductive type corresponds to n type.

To obtain the semiconductor layer, for example, a wafer according to an epitaxial growth method or an FZ (Floating Zone) method can be used.

The power semiconductor device is not limited to an IGBT or an MOSFET, and may be, for example, a CSTBT.

The power semiconductor device is, for example, a silicon device, but is not limited thereto. The power semiconductor device may be, for example, a silicon-carbide device, which has been developed in recent years and is expected for high efficiency.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A power semiconductor device, comprising:

a first electrode; and a semiconductor layer provided on said first electrode, a trench being formed on said semiconductor layer at a surface opposite to a surface facing said first electrode, said semiconductor layer including a first layer of a first conductive type, provided on said first electrode, a second layer of a second conductive type which is different from the first conductive type, provided on said first layer, and a third layer provided on said second layer and having a first region of said first conductive type and a second region of said second conductive type, the power semiconductor device further comprising:

a second electrode in contact with each of said first and second regions;

a gate insulating film covering an inner wall of said trench; and a gate electrode embedded in said trench with said gate insulating film interposed therebetween, said gate electrode including a first portion projecting into said first layer through said first region and said second layer, and a second portion projecting into said first layer through said second region and said second layer, said second portion projecting into said first layer deeper than a depth in which said first portion projects into said first layer.

2. The power semiconductor device according to claim 1, wherein in said trench, a portion in which said second portion of said gate electrode is embedded has a width wider than that of a portion in which said first portion of said gate electrode is embedded.

3. The power semiconductor device according to claim 1, wherein said semiconductor layer includes a fourth layer of said second conductive type between said first electrode and said first layer.

* * * * *